US011864387B2

(12) United States Patent
Xu et al.

(10) Patent No.: US 11,864,387 B2
(45) Date of Patent: Jan. 2, 2024

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Lifang Xu, Boise, ID (US); Indra V. Chary, Boise, ID (US); Justin B. Dorhout, Boise, ID (US); Jian Li, Boise, ID (US); Haitao Liu, Boise, ID (US); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/083,412

(22) Filed: Dec. 16, 2022

(65) Prior Publication Data

US 2023/0143406 A1 May 11, 2023

Related U.S. Application Data

(62) Division of application No. 16/550,252, filed on Aug. 25, 2019, now Pat. No. 11,563,022.

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76816* (2013.01); *H01L 21/76877* (2013.01);
(Continued)

(58) Field of Classification Search
CPC ......... H01L 21/76816; H01L 21/76877; H01L 23/5226; H01L 23/5283; H01L 27/11524;
(Continued)

(56) References Cited

U.S. PATENT DOCUMENTS 6,066,869 A 5/2000 Noble et al.
8,492,278 B2 7/2013 Good et al.
(Continued)

FOREIGN PATENT DOCUMENTS

WO PCT/US2020/045841 11/2020
WO WO 2020/252892 12/2020
WO PCT/US2020/045841 3/2022

OTHER PUBLICATIONS

Jang et al., "Vertical Cell Array using TCAT (Terabit Cell Array Transistor) Technology for Ultra High Density NAND Flash Memory", IEEE, Symposium on VLSI Technology Digest of Technical Papers, 2009, United States, pp. 192-193.

*Primary Examiner* — Calvin Y Choi
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The operative channel-material strings in the laterally-spaced memory blocks comprise part of a memory plane. An elevationally-extending wall is in the memory plane laterally-between immediately-laterally-adjacent of the memory blocks and that completely encircles an island that is laterally-between immediately-laterally-adjacent of the memory blocks in the memory plane. Other embodiments, including method are disclosed.

20 Claims, 42 Drawing Sheets

(51) Int. Cl.

| | |
|---|---|
| ***H01L 23/522*** | (2006.01) |
| ***H01L 23/528*** | (2006.01) |
| ***H10B 41/27*** | (2023.01) |
| ***H10B 41/35*** | (2023.01) |
| ***H10B 43/35*** | (2023.01) |

(52) U.S. Cl.
CPC ...... *H01L 23/5226* (2013.01); *H01L 23/5283* (2013.01); *H10B 41/27* (2023.02); *H10B 41/35* (2023.02); *H10B 43/35* (2023.02)

(58) Field of Classification Search
CPC ......... H01L 27/11556; H01L 27/11565; H01L 27/1157; H01L 27/11575; H01L 27/11582
See application file for complete search history.

(56) References Cited

U.S. PATENT DOCUMENTS

| | | | | |
|---|---|---|---|---|
| 8,735,216 | B2 | 3/2014 | Liu et al. | |
| 8,980,752 | B2 | 3/2015 | Good et al. | |
| 9,786,673 | B1 | 10/2017 | Cho et al. | |
| 9,893,083 | B1 | 2/2018 | Wang et al. | |
| 9,997,353 | B1 | 6/2018 | Kumar et al. | |
| 10,014,309 | B2 | 7/2018 | Dorhout et al. | |
| 10,290,643 | B1 | 5/2019 | Kai et al. | |
| 10,381,377 | B2 | 8/2019 | Wang et al. | |
| 10,388,665 | B1 | 8/2019 | Xie et al. | |
| 10,553,607 | B1 | 2/2020 | Howder et al. | |
| 11,444,093 | B2 | 9/2022 | Tiwari | |
| 2008/0014761 | A1 | 1/2008 | Bhatia et al. | |
| 2011/0298013 | A1 | 12/2011 | Hwang et al. | |
| 2012/0052672 | A1 | 3/2012 | Nakanishi et al. | |
| 2012/0098050 | A1 | 4/2012 | Shim et al. | |
| 2012/0119287 | A1 | 5/2012 | Park et al. | |
| 2012/0168829 | A1 | 7/2012 | Zhong et al. | |
| 2012/0208347 | A1 | 8/2012 | Hwang et al. | |
| 2013/0009236 | A1 | 1/2013 | Lee et al. | |
| 2013/0140623 | A1 | 6/2013 | Lee et al. | |
| 2015/0206900 | A1 | 7/2015 | Nam et al. | |
| 2015/0214241 | A1 | 7/2015 | Lee | |
| 2015/0303214 | A1 | 10/2015 | Kim et al. | |
| 2015/0318301 | A1 | 11/2015 | Lee et al. | |
| 2015/0340377 | A1 | 11/2015 | Lee | |
| 2016/0049421 | A1 | 2/2016 | Zhang et al. | |
| 2016/0204117 | A1 | 7/2016 | Liu et al. | |
| 2016/0268302 | A1 | 9/2016 | Lee et al. | |
| 2016/0336338 | A1 | 11/2016 | Song et al. | |
| 2016/0336340 | A1 | 11/2016 | Song et al. | |
| 2016/0343726 | A1 | 11/2016 | Yune | |
| 2017/0062470 | A1 | 3/2017 | Han et al. | |
| 2017/0148805 | A1 | 5/2017 | Nishikawa et al. | |
| 2017/0250193 | A1 | 8/2017 | Huo | |
| 2017/0256645 | A1 | 9/2017 | Chung et al. | |
| 2017/0278859 | A1 | 9/2017 | Sharangpani et al. | |
| 2018/0047739 | A1 | 2/2018 | Dourhout et al. | |
| 2018/0130814 | A1 | 5/2018 | Lee | |
| 2018/0261615 | A1 | 9/2018 | Minemura | |
| 2018/0261616 | A1* | 9/2018 | Cho | ...................... H10B 43/20 |
| 2018/0294273 | A1 | 10/2018 | Liao et al. | |
| 2018/0342528 | A1 | 11/2018 | Lee | |
| 2019/0019724 | A1 | 1/2019 | Cheng et al. | |
| 2019/0067182 | A1 | 2/2019 | Lee | |
| 2019/0088671 | A1 | 3/2019 | Greenlee et al. | |
| 2019/0237476 | A1 | 8/2019 | Lee et al. | |
| 2019/0312054 | A1 | 10/2019 | Yun et al. | |
| 2019/0326313 | A1 | 10/2019 | Cui et al. | |
| 2019/0363100 | A1 | 11/2019 | Lee et al. | |
| 2019/0393238 | A1 | 12/2019 | Lim et al. | |
| 2020/0058673 | A1 | 2/2020 | Nishikawa et al. | |
| 2020/0098781 | A1 | 3/2020 | Xiao | |
| 2020/0119036 | A1 | 4/2020 | King et al. | |
| 2020/0127005 | A1 | 4/2020 | Otsu et al. | |
| 2020/0194373 | A1 | 6/2020 | Baek et al. | |
| 2020/0295031 | A1 | 9/2020 | Lue | |
| 2020/0312863 | A1 | 10/2020 | Iwai et al. | |
| 2020/0388629 | A1 | 12/2020 | Lee et al. | |
| 2020/0402890 | A1 | 12/2020 | Chary et al. | |
| 2021/0043640 | A1 | 2/2021 | Kawaguchi et al. | |
| 2021/0043647 | A1 | 2/2021 | Kim et al. | |
| 2021/0050364 | A1 | 2/2021 | Tapias et al. | |
| 2021/0057428 | A1 | 2/2021 | Hu et al. | |
| 2021/0057433 | A1 | 2/2021 | Zhang et al. | |
| 2021/0057439 | A1 | 2/2021 | Tessariol et al. | |
| 2021/0057440 | A1 | 2/2021 | Greenlee et al. | |
| 2021/0057441 | A1 | 2/2021 | Xu et al. | |
| 2021/0111064 | A1 | 4/2021 | Billingsley et al. | |
| 2021/0118899 | A1 | 4/2021 | King et al. | |
| 2021/0125919 | A1 | 4/2021 | Machkaoutsan et al. | |
| 2021/0125920 | A1 | 4/2021 | Hu et al. | |
| 2021/0202324 | A1 | 7/2021 | Scarbrough et al. | |
| 2022/0336278 | A1 | 10/2022 | Chandolu et al. | |

* cited by examiner

MEMORY ARRAYS AND METHODS USED IN FORMING A MEMORY ARRAY COMPRISING STRINGS OF MEMORY CELLS

RELATED PATENT DATA

This patent resulted from a divisional of U.S. patent application Ser. No. 16/550,252 filed Aug. 25, 2019 which is hereby incorporated by reference herein.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 8 and 9 and subsequent figures corresponding there-from are at about half-scale that of FIGS. 2, 3, 4, 5, 6, and 7 due to drawing constraints.

DETAILED DESCRIPTION OF EXAMPLE EMBODIMENTS

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are first described with reference to FIGS. 1-50 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
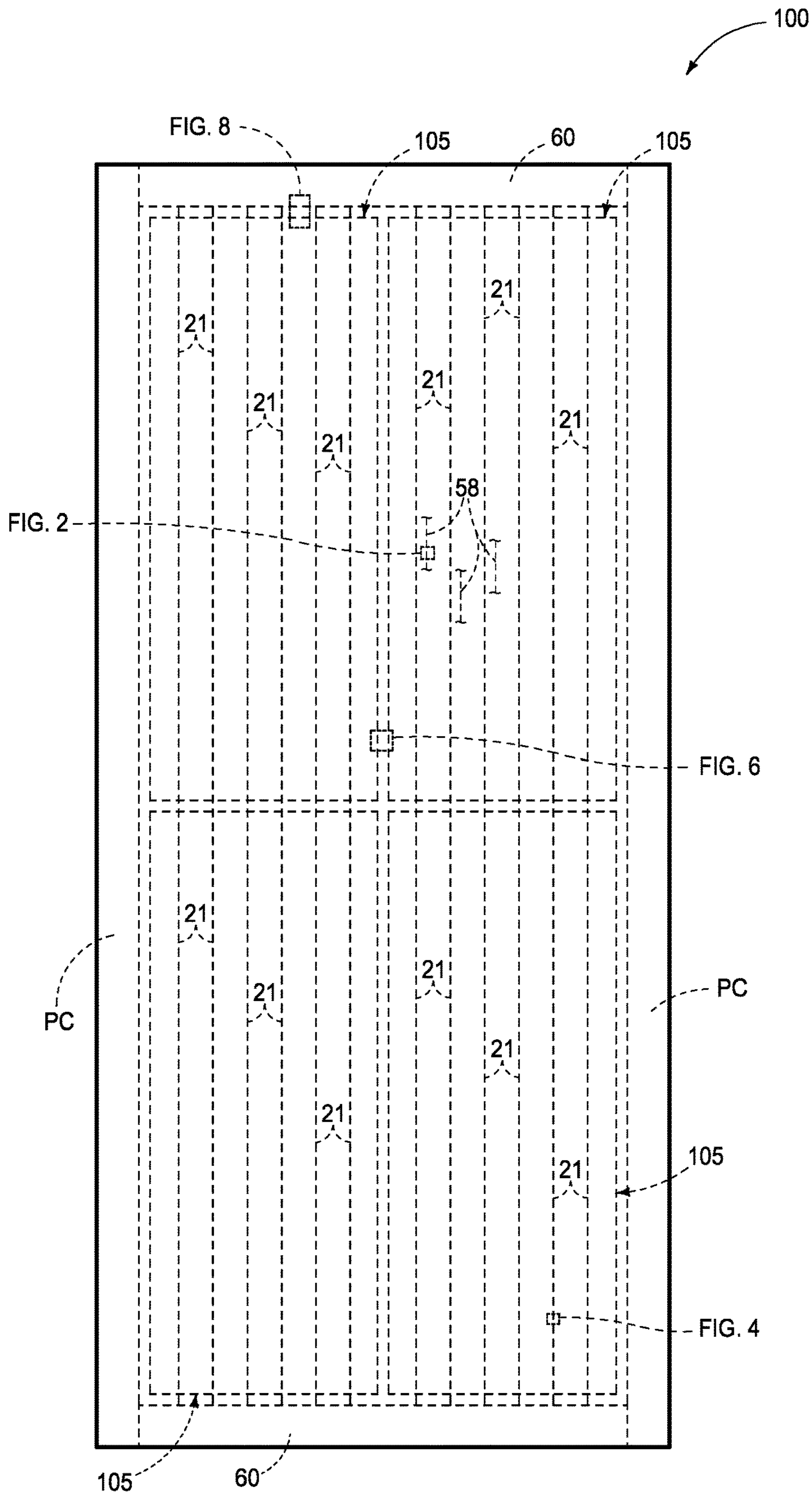
FIG. 1 is a diagrammatic top plan view of a die or die area that may be part of a larger substrate (e.g., a semiconductor wafer, and not shown)
Figure 2:
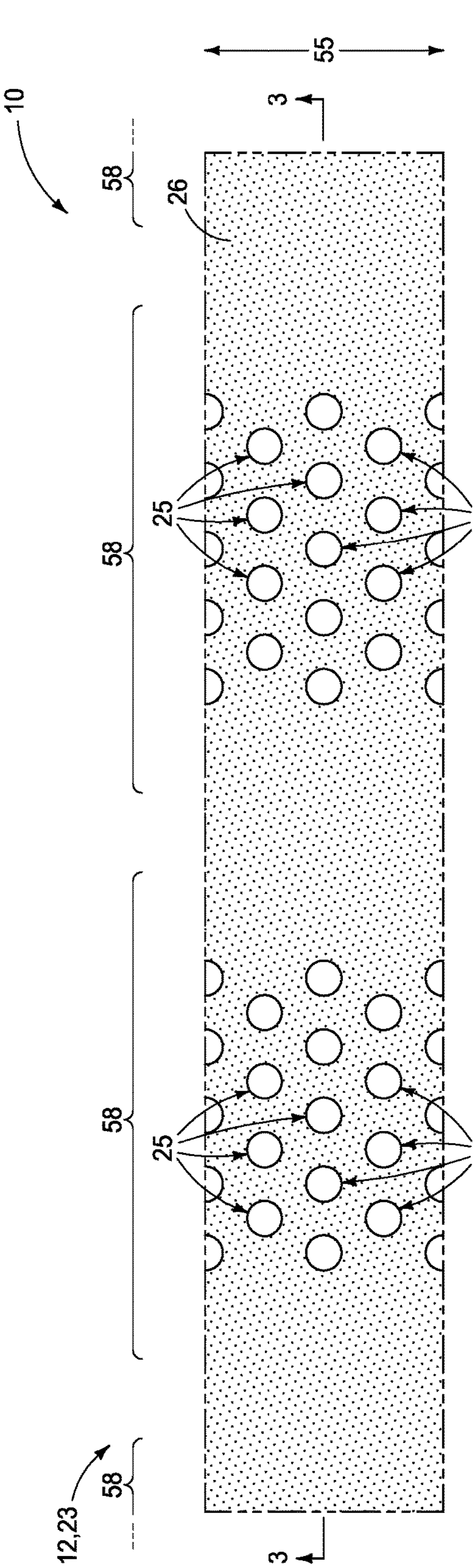
FIG. 2 is an enlarged diagrammatic cross-section view of a portion of FIG. 1 in process in accordance with an embodiment of the invention, and is through line 2-2 in FIG. 3.
Figure 3:
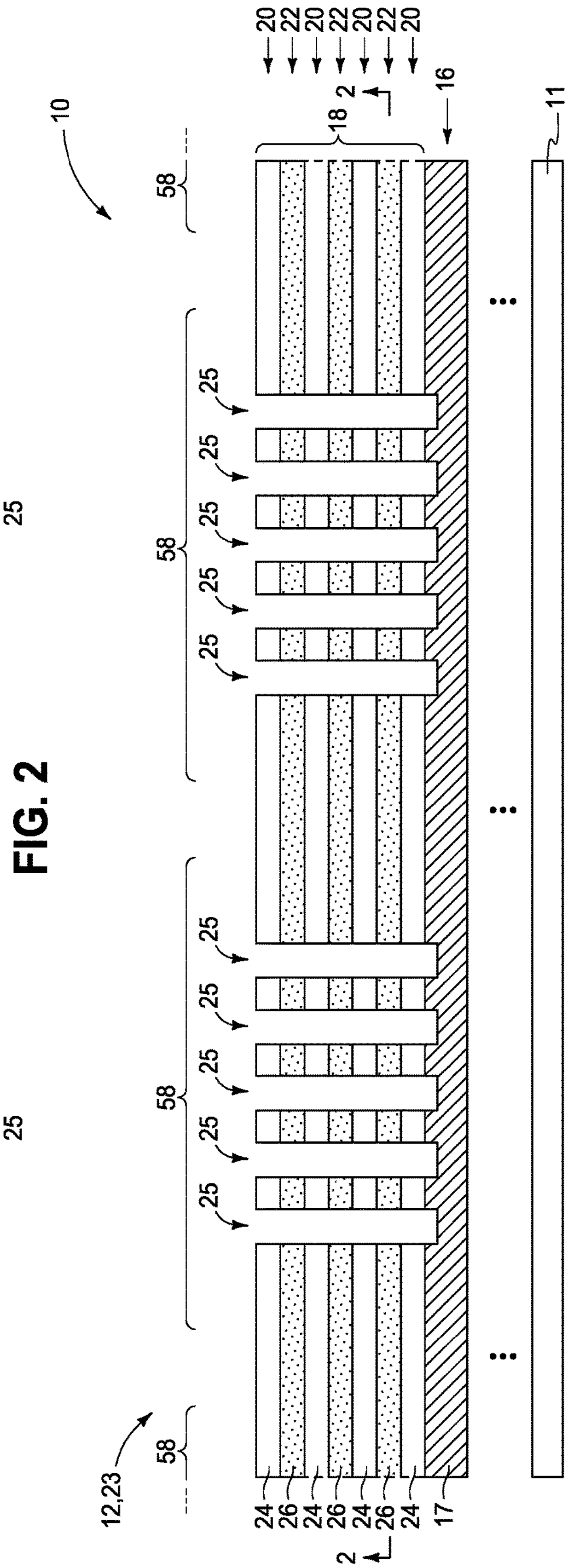
FIG. 3 is a diagrammatic cross-section view through line 3-3 in FIG. 2.
Figure 4:
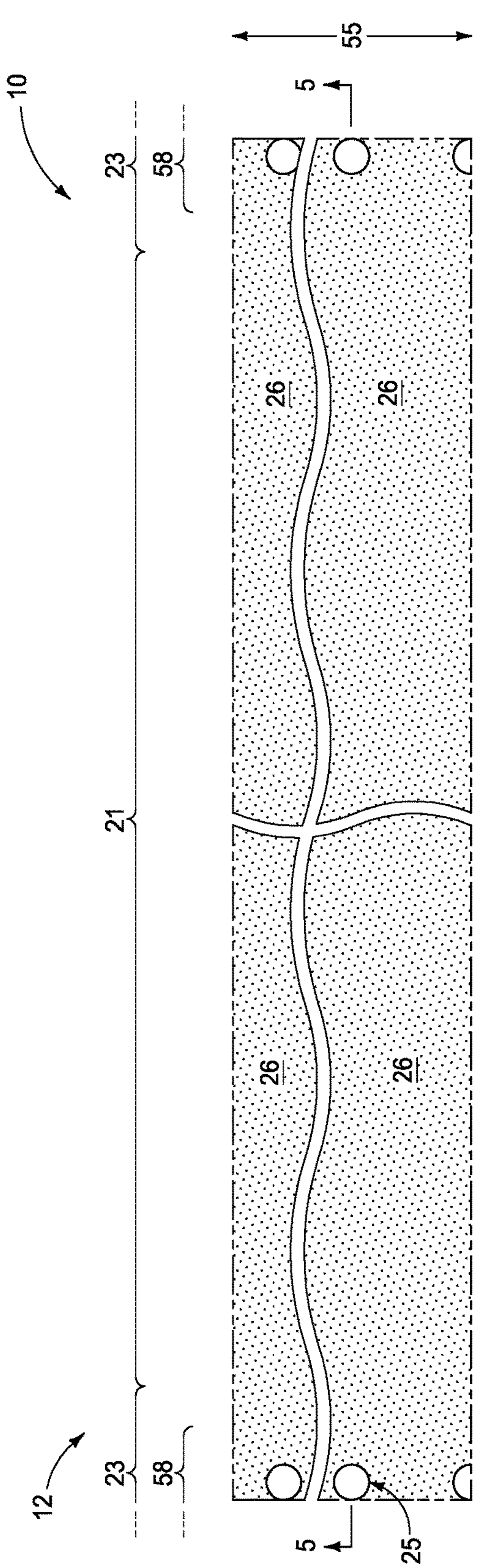
FIGS. 4-50 are diagrammatic sequential sectional and/or enlarged views of the construction of FIG. 1, or portions thereof, in process in accordance with some embodiments of the invention.
Figure 5:
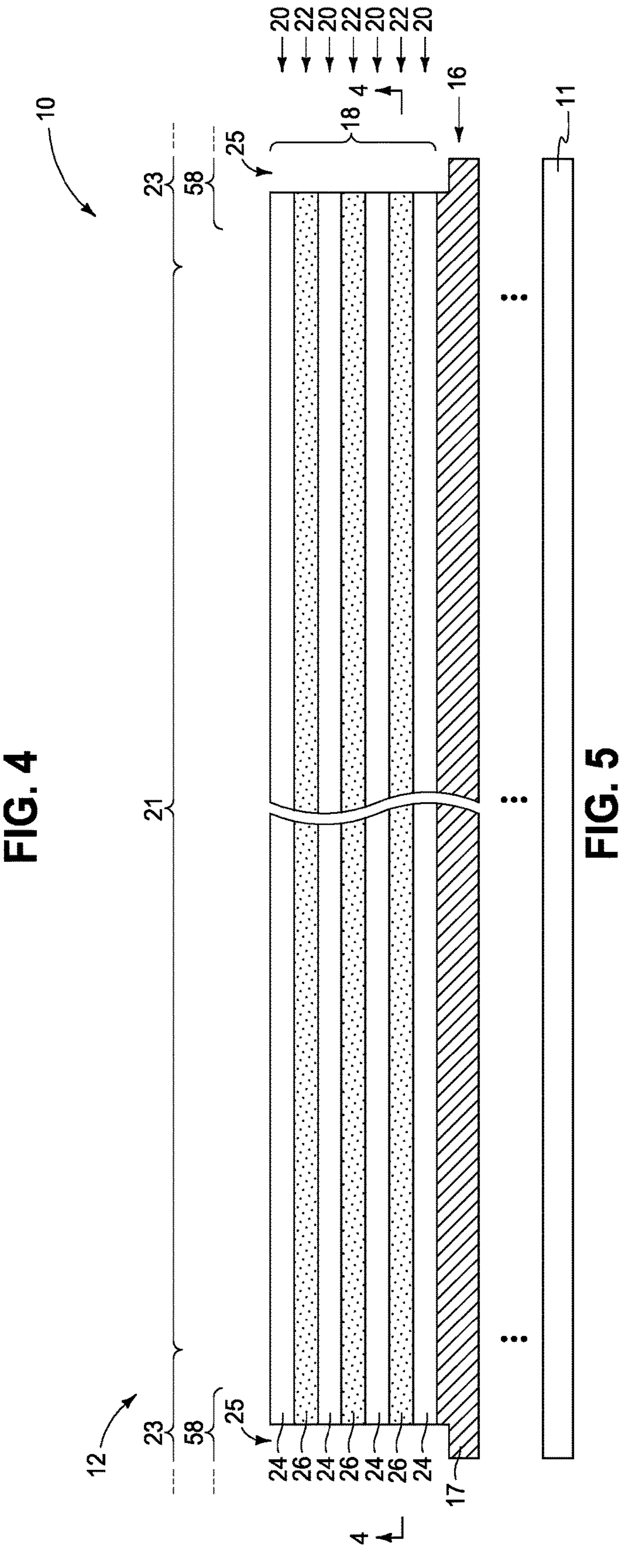
Figure 6:
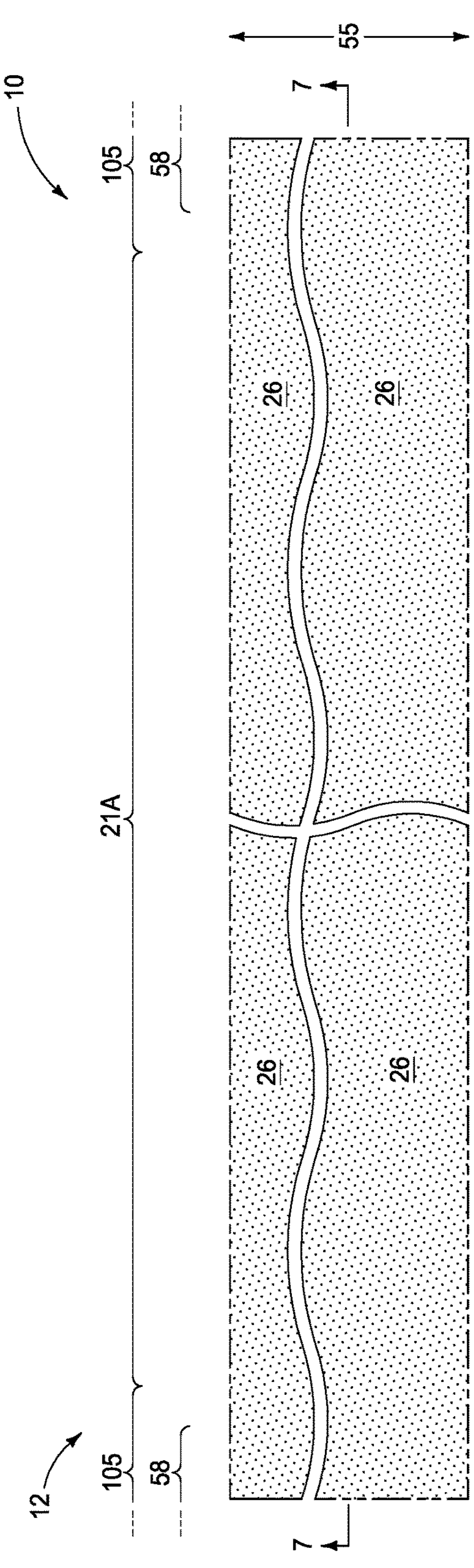
Figure 7:
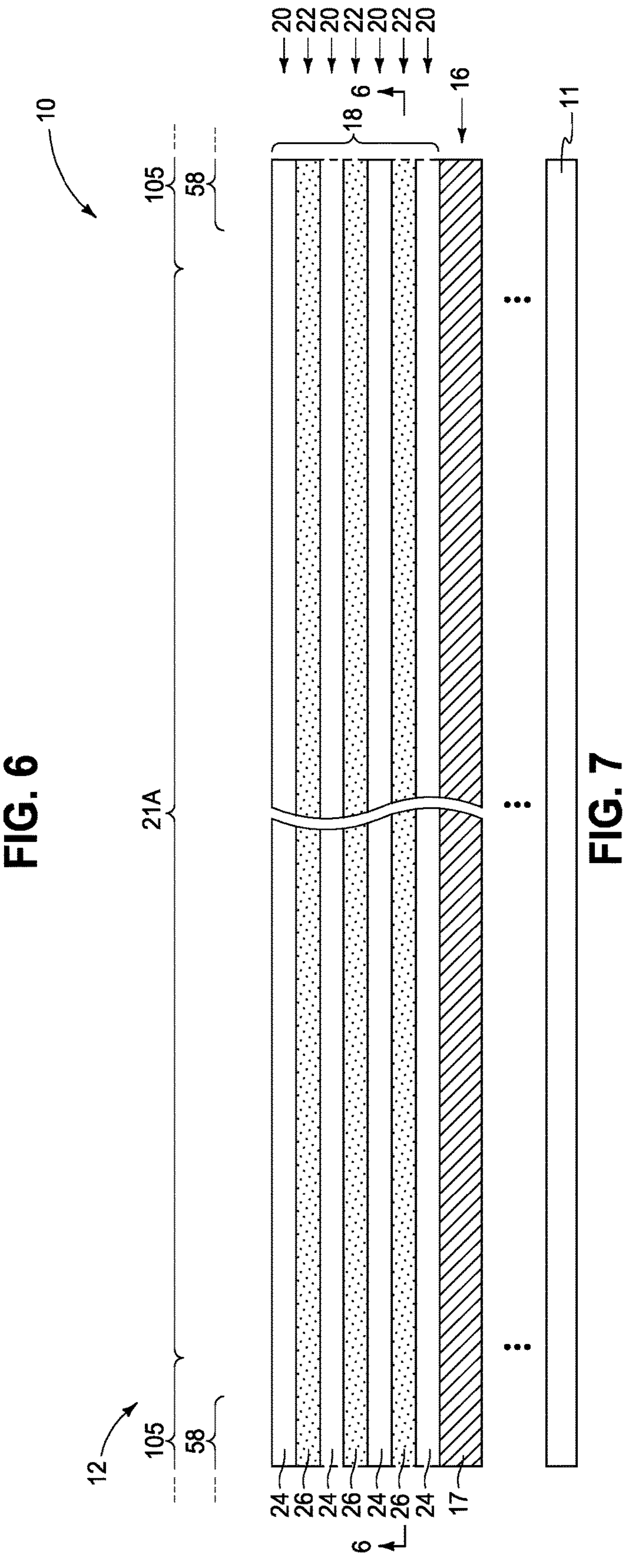

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Stair-step region 60 may be considered as comprising landing regions 62. Regions 105, 58, 60, 62, and/or PC may not be discernable at this point of processing. FIGS. 2-9 are diagrammatic larger and varied scale views of portions of die area 100.

Referring to FIGS. 2-9, a construction 10 is shown in a method of forming an array/array region 12 of elevationally-extending strings of transistors and/or memory cells (not yet fabricated). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 2-9-depicted materials. For example, other partially or wholly fabricated components of integrated circuitry may be provided somewhere above, about, or within base substrate 11. Control and/or other peripheral circuitry for operating components within an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed in memory-array region 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Figure 8:
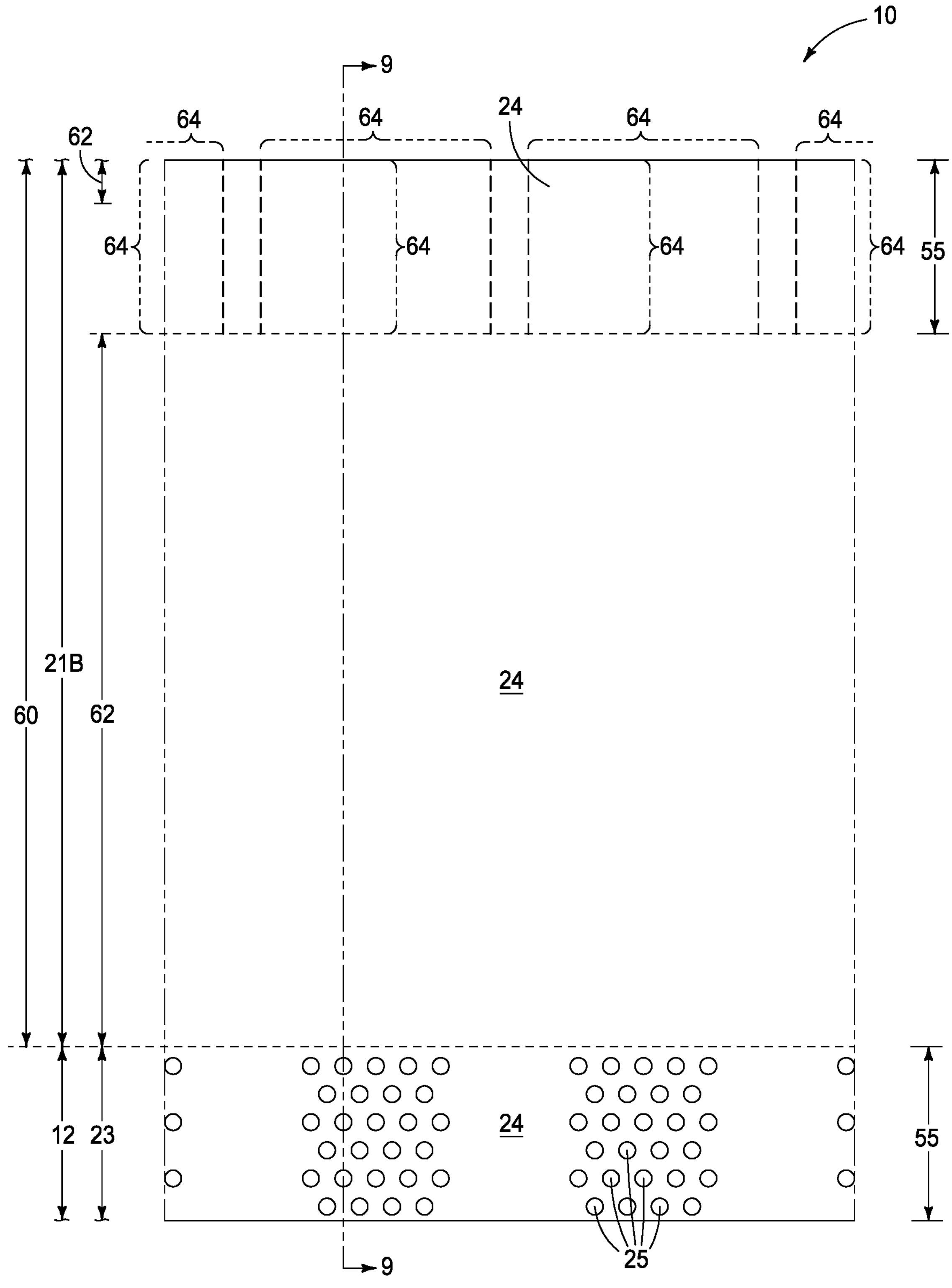
Figure 9:
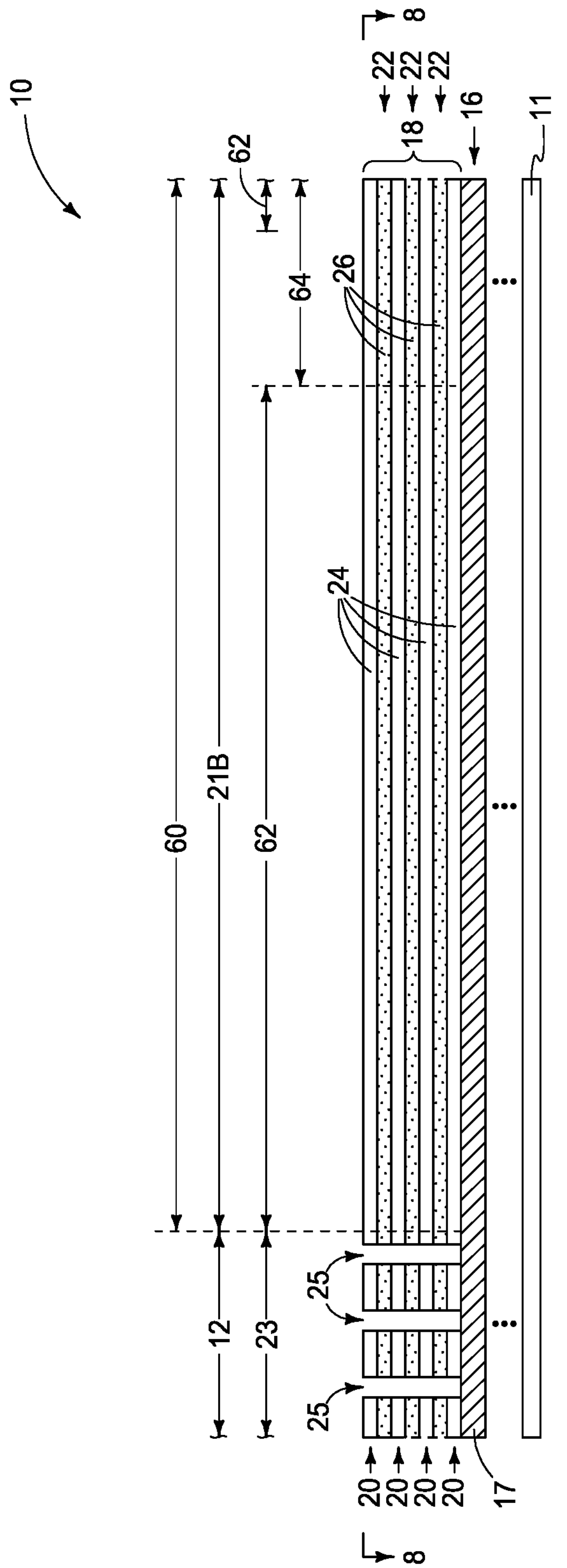
Figure 10:
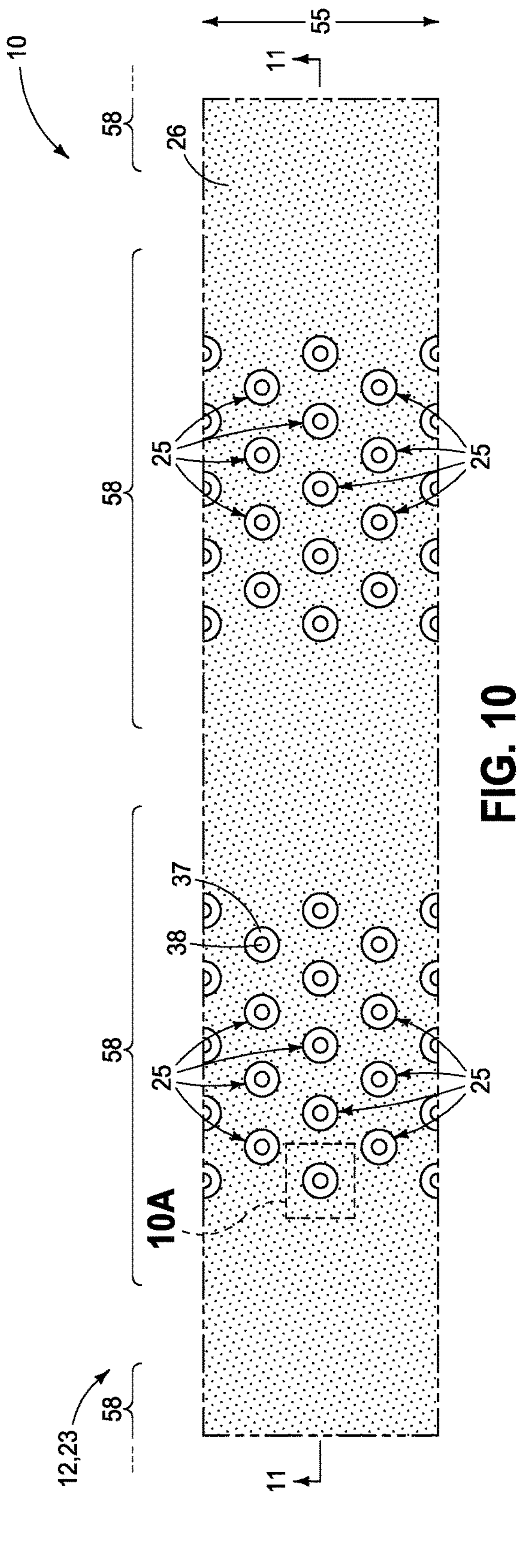
Figure 11:
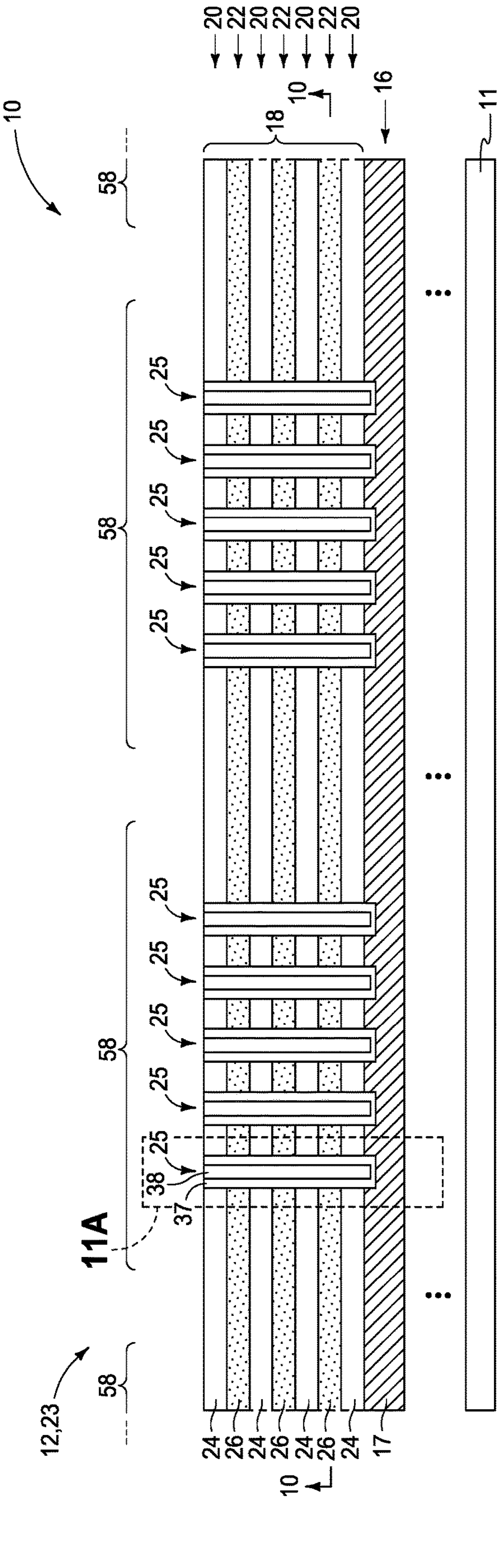
Figure 11A:
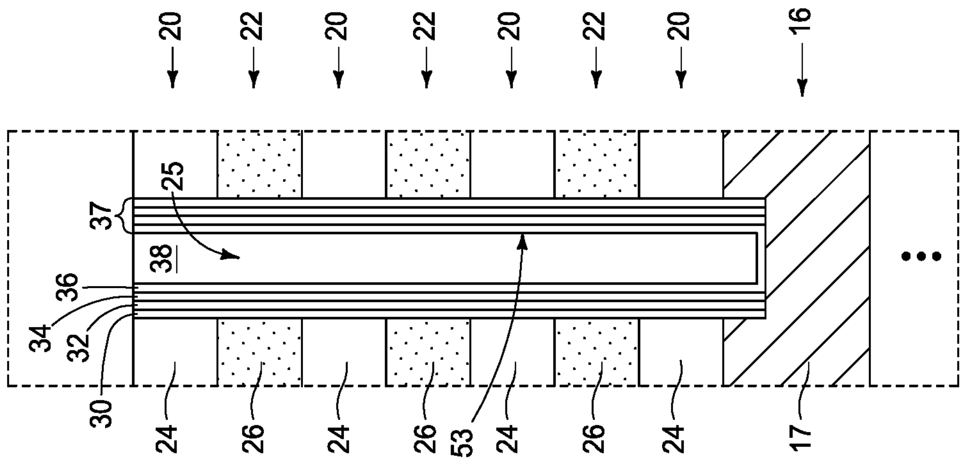
Figure 10A:
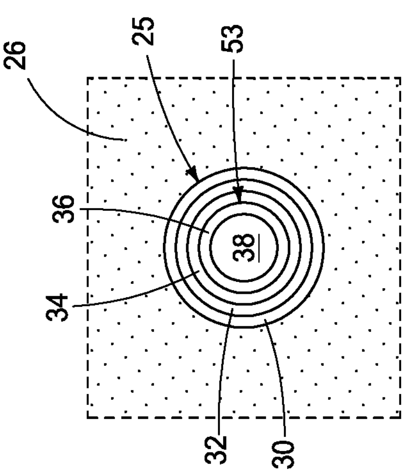
Figure 12:
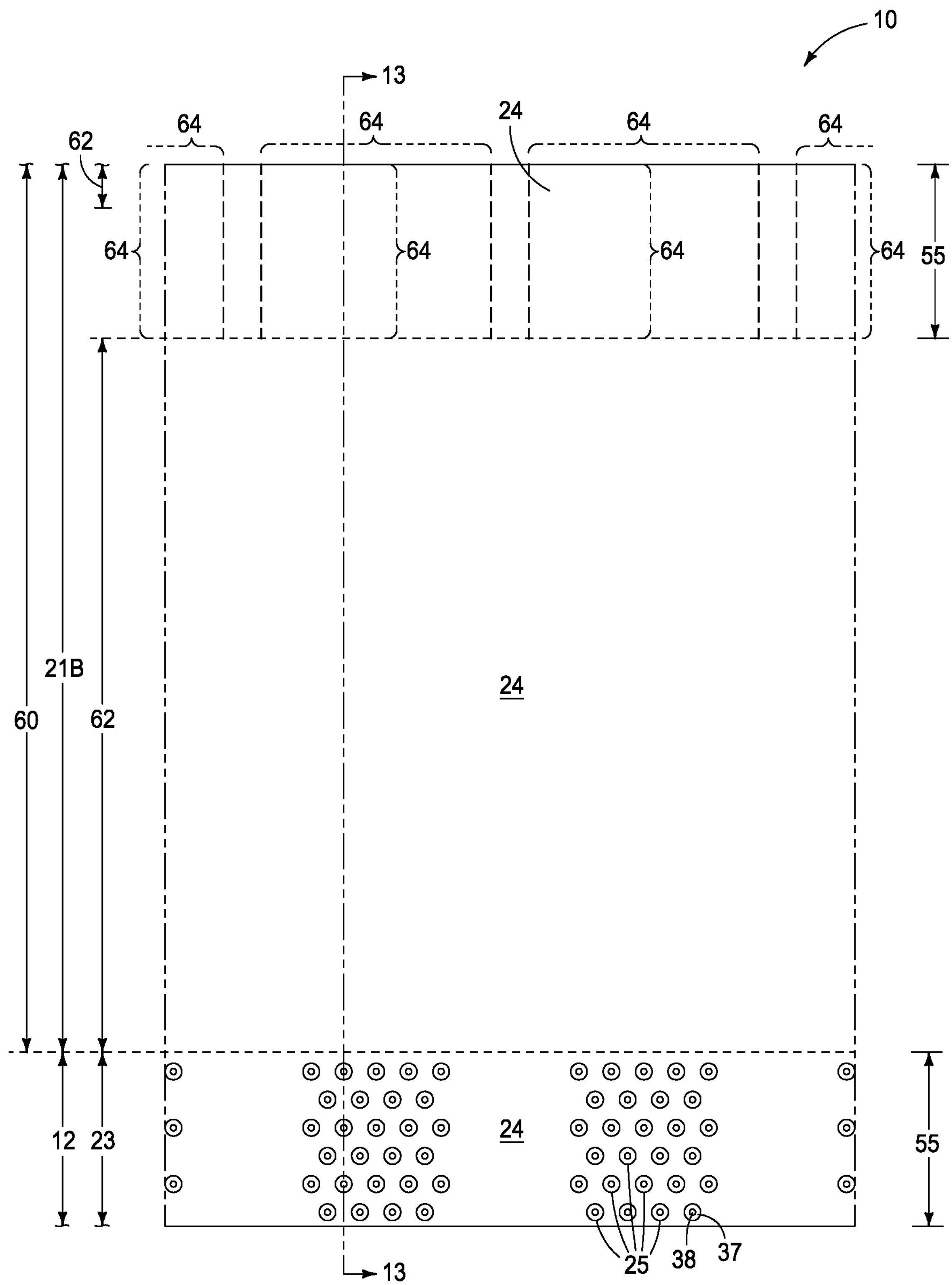
Figure 13:
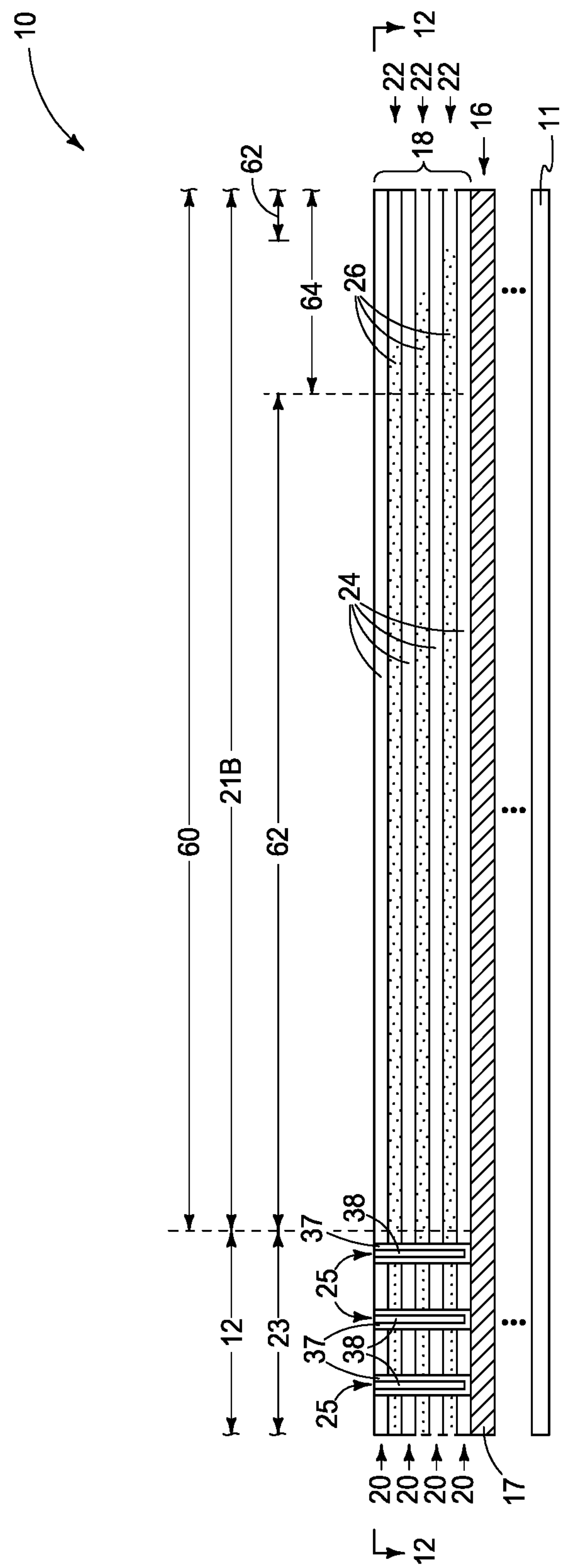

Stack 18 comprises a through-array-via (TAV) region (e.g., any one of regions 21, 21A, 21B) and an operative memory-cell-string region 23. An "operative memory-cell string region" contains circuit-operative memory-cell strings in the finished construction of integrated circuitry that has been or is being fabricated. Dummy memory-cell strings (i.e., circuit-inoperative memory-cell strings comprising inoperative channel material, and not shown) may be between the TAV region and operative memory-cell-string region 23 including in the TAV region. A "TAY region" is a region in which operative TAVs are present or will be formed. An "operative TAY" is a circuit-operative conductive interconnect extending through stack 18 and between electronic components at different elevations in a finished construction of integrated circuitry that has been or is being fabricated. A TAV region may also contain one or more dummy TAVs (i.e., a circuit-inoperative structure extending through stack 18 that may be in a finished construction of integrated circuitry that has been or is being fabricated). Regions 21/21A/21B may essentially be undefined or indistinguishable relative one another in construction 10 at this point in processing. Example TAV region 21 is shown as being in individual memory planes 105 (FIG. 1). Region 21A (FIGS. 6 and 7) is shown as being outside of individual memory-plane regions 105 with, in one example, shown as being edge-of-plane (i.e., outside of a memory-plane region 105 and adjacent a lateral edge of the subject memory plane). Example TAV region 21B is shown as being outside of individual memory-plane regions 105 in stair-step region 60. Laterally-spaced stair-step-structure regions 64 are in stair-step region 60, may not be discernable at this point of processing, and will comprise operative stair-step structures 64 in a finished circuitry construction. Stair-step structure regions 64 may be individually horizontally-longitudinally-elongated (e.g., along a direction 55 as shown in FIG. 8 proximate stair-step structure regions 64).

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. Memory-block regions 58 and resultant memory blocks 58 (not yet shown) may be considered as being longitudinally elongated and oriented, for example along a direction 55 that may be the same as or different from direction 55 referred to above with respect to stair-step structure regions 64. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 10, 10A, 11, 11A, 12, and 13 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 10, 11, 12, and 13 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel-material strings 53 for better conductive connection to overlying circuitry (not shown).

Figure 14:
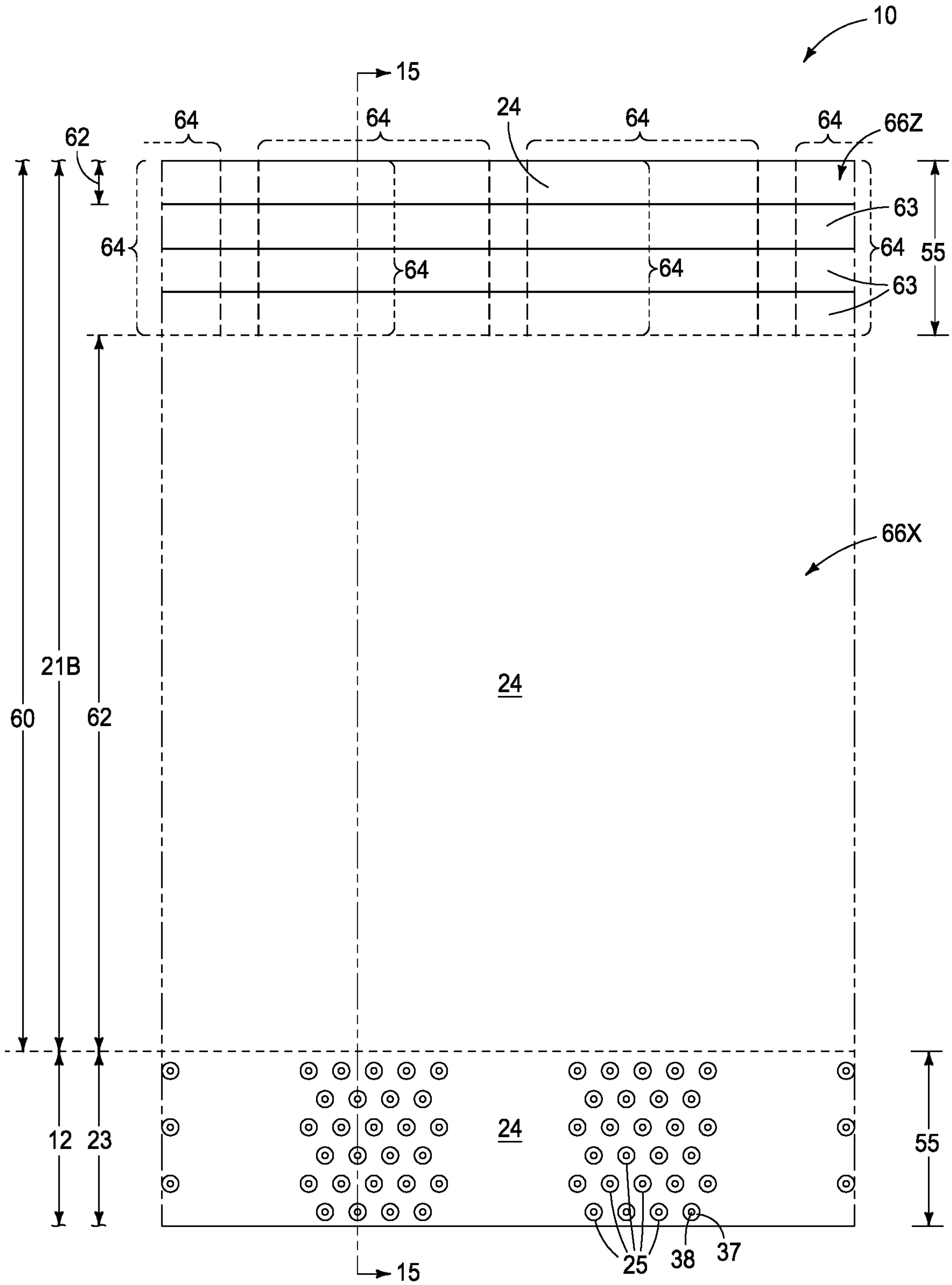
Figure 15:
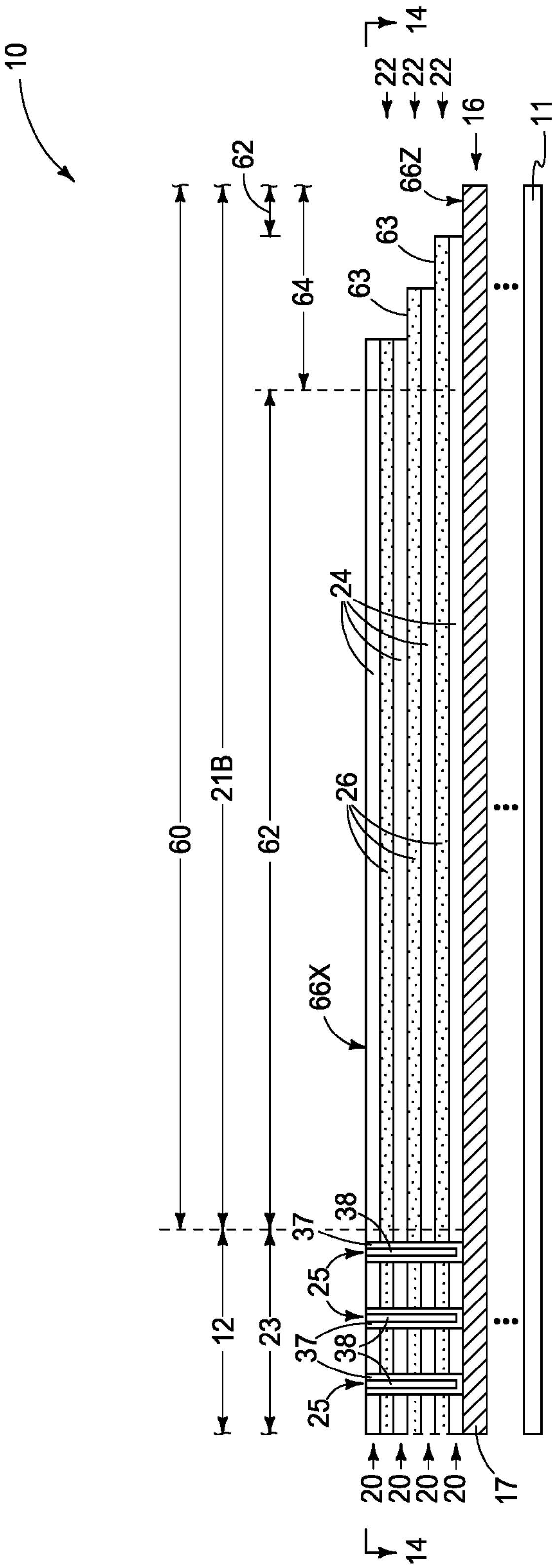
Figure 16:
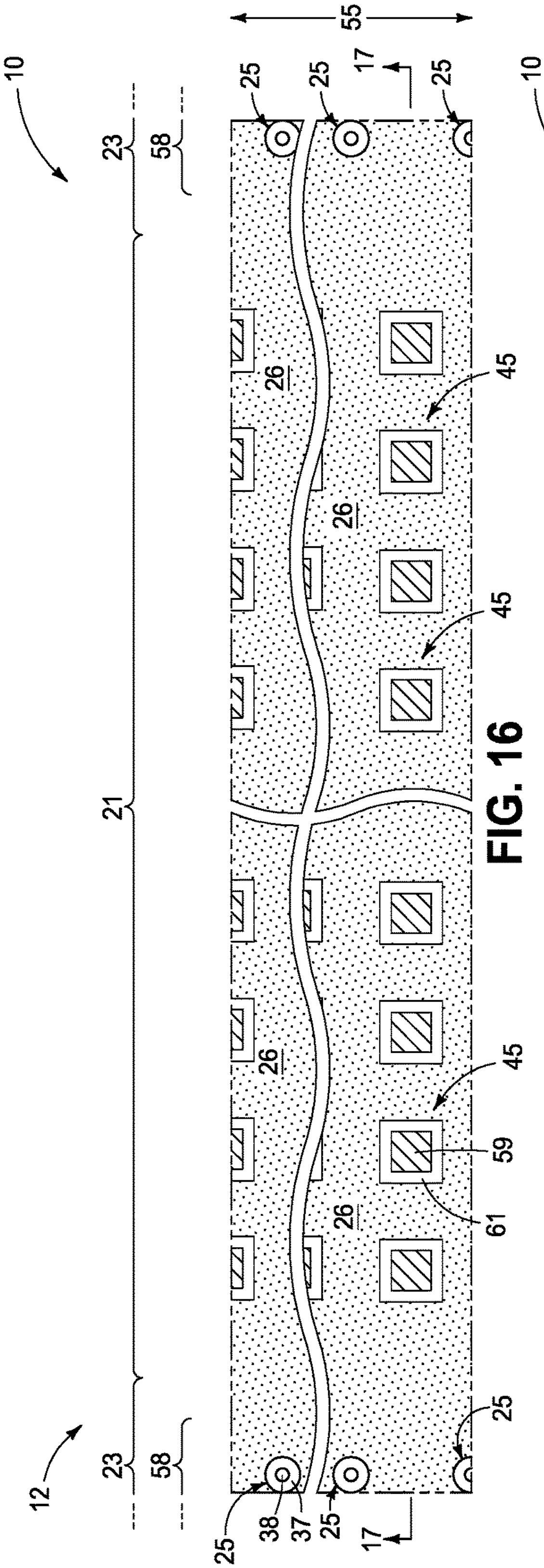
Figure 17:
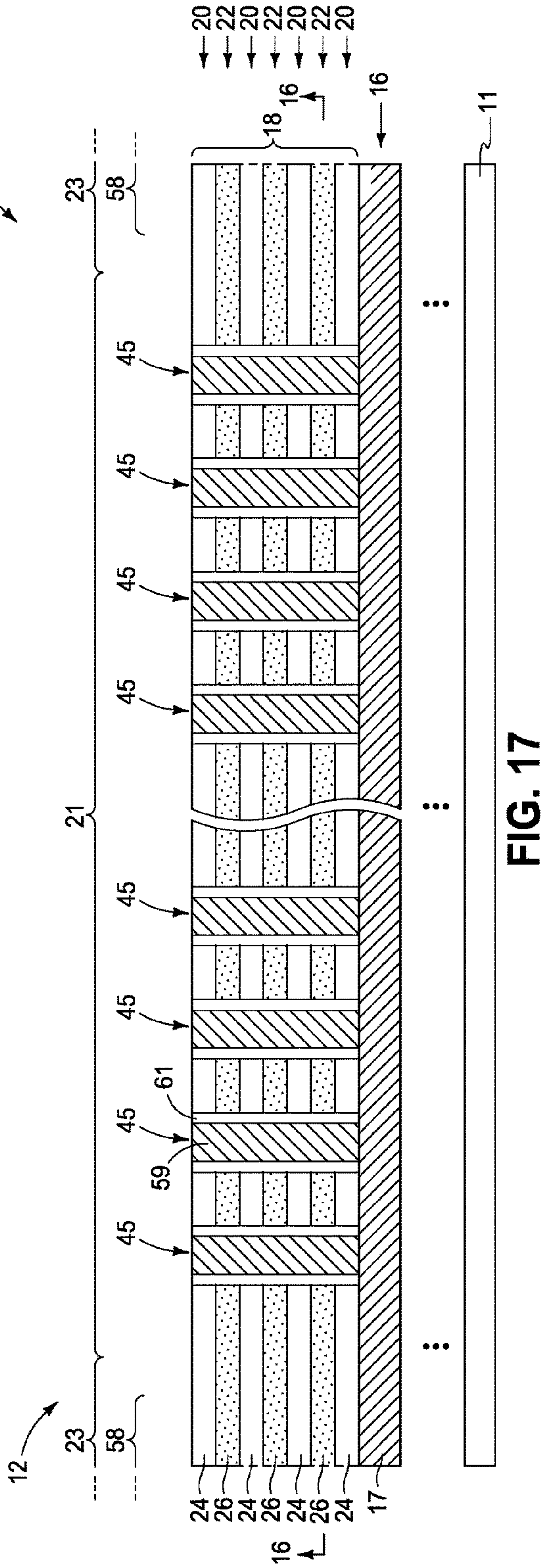
Figure 18:
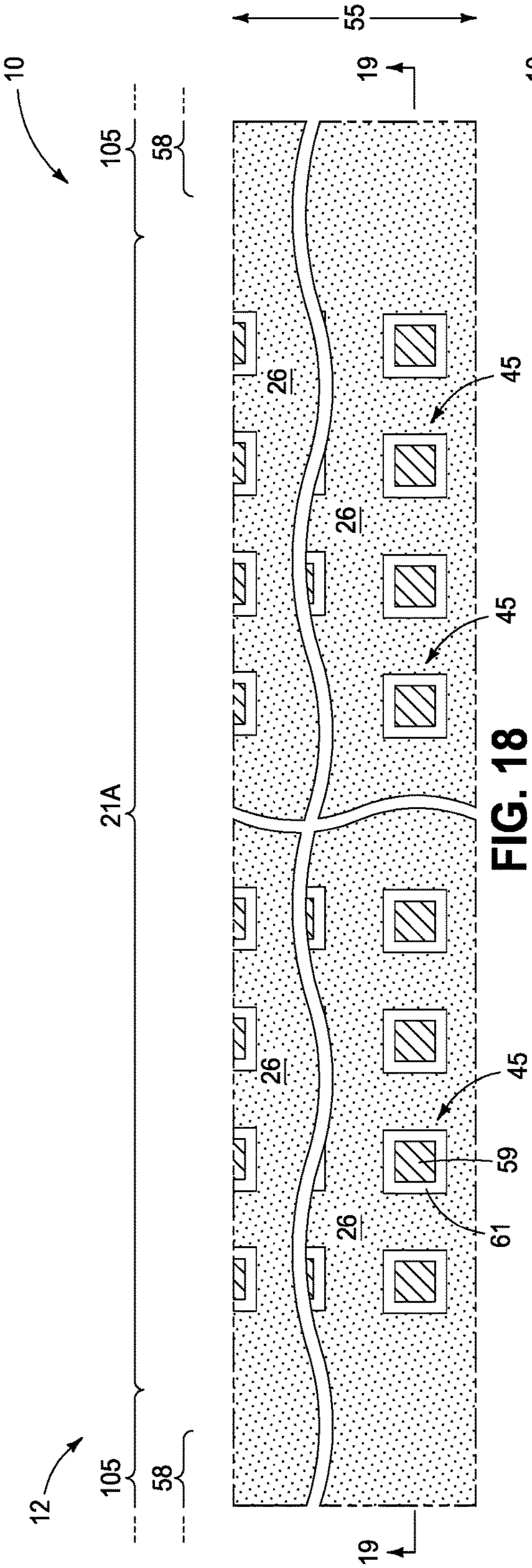
Figure 19:
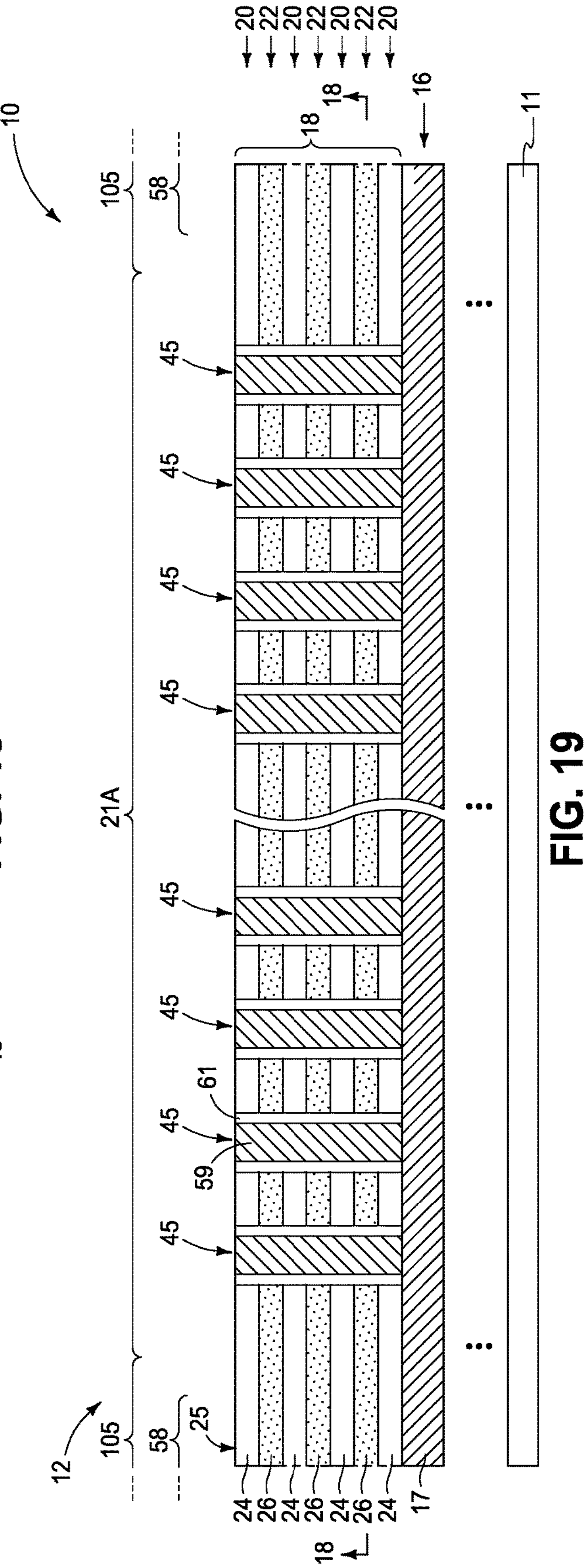
Figure 20:
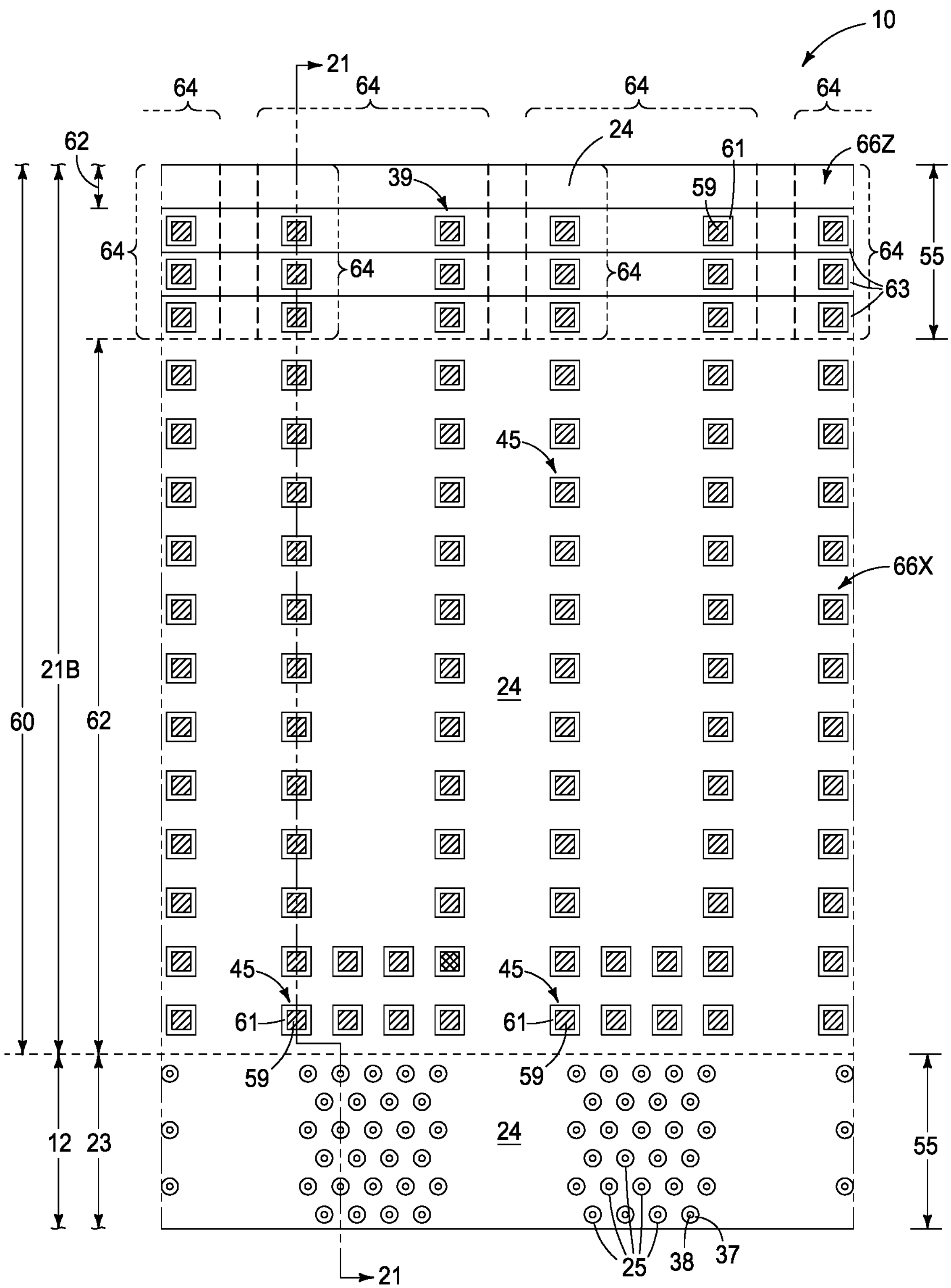
Figure 21:
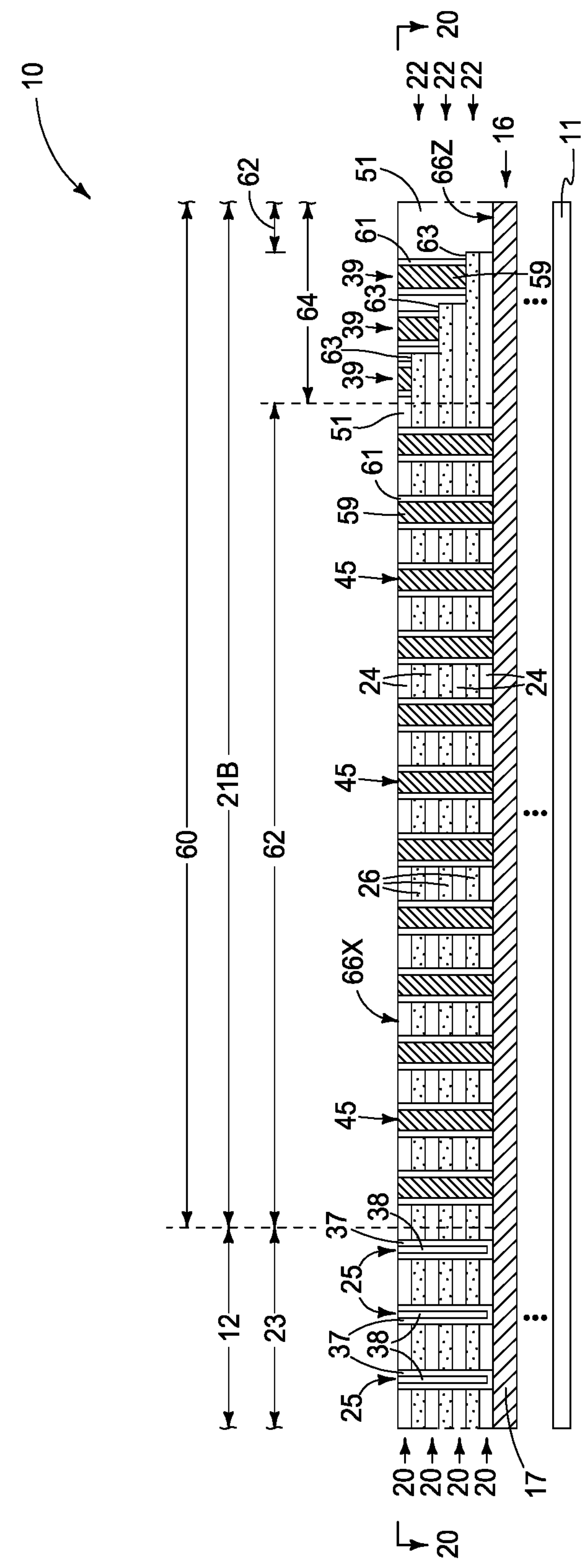
Figure 22:
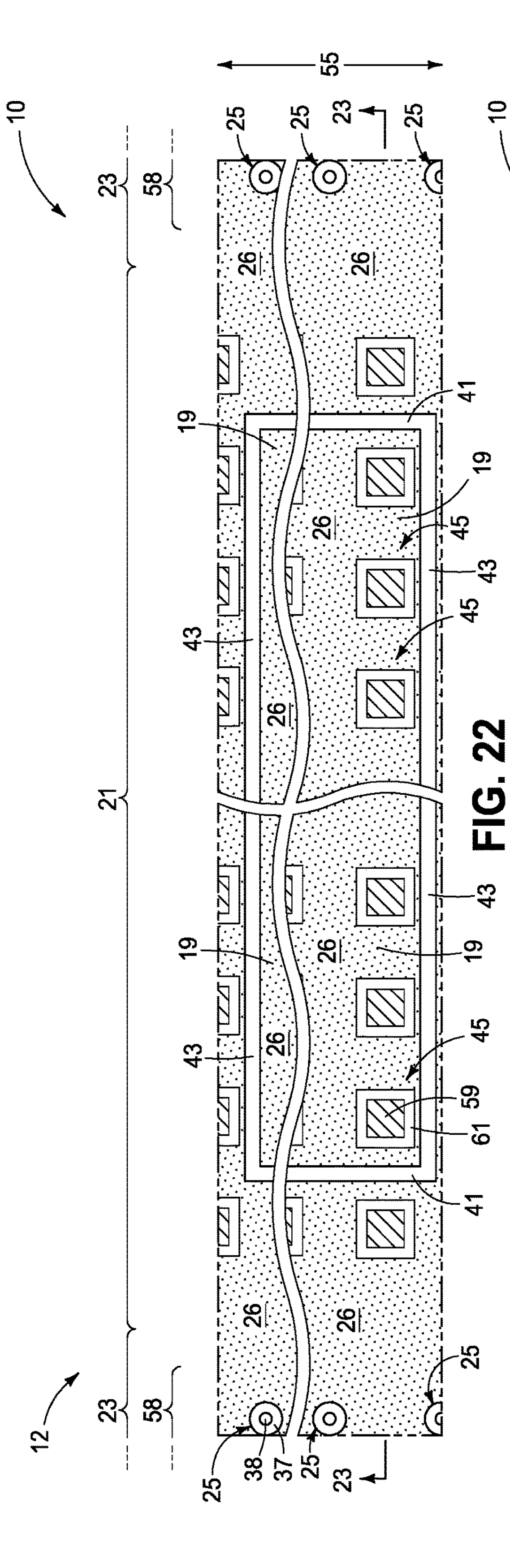
Figure 23:
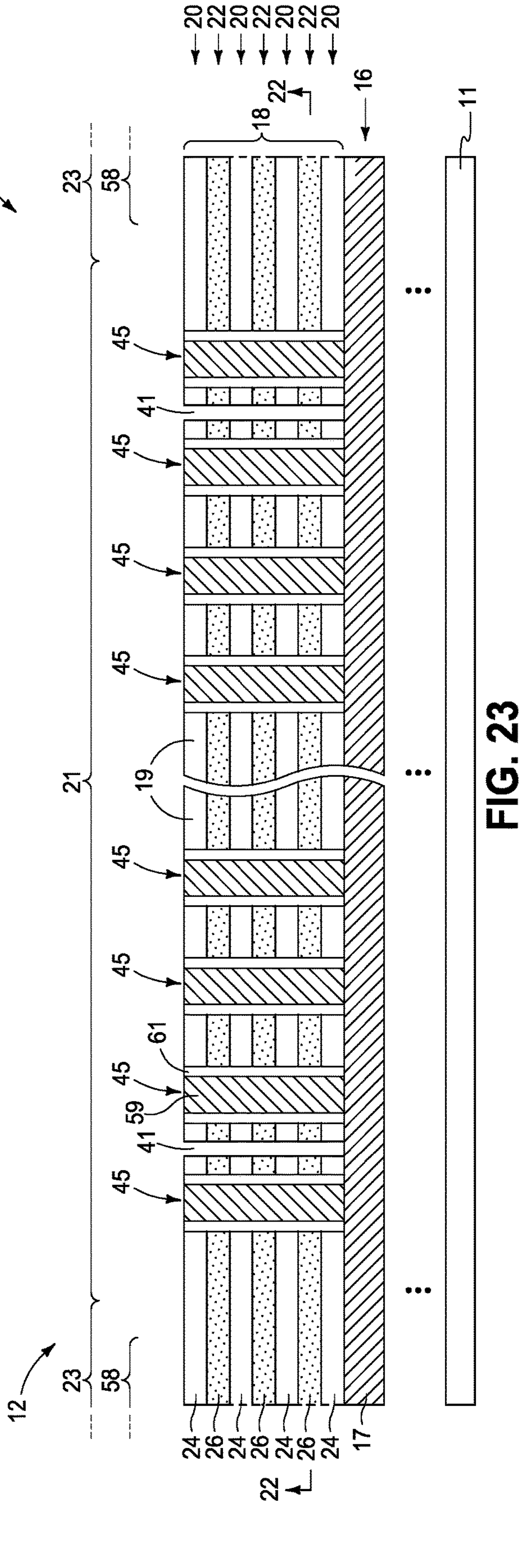
Figure 24:
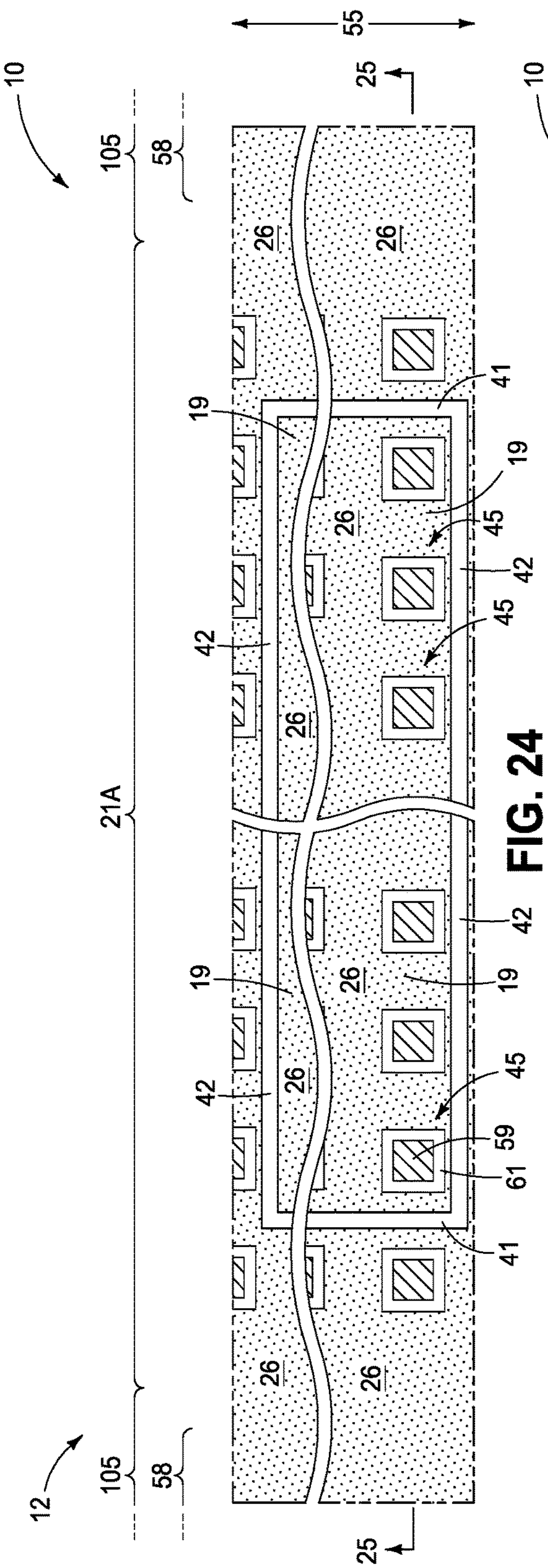
Figure 25:
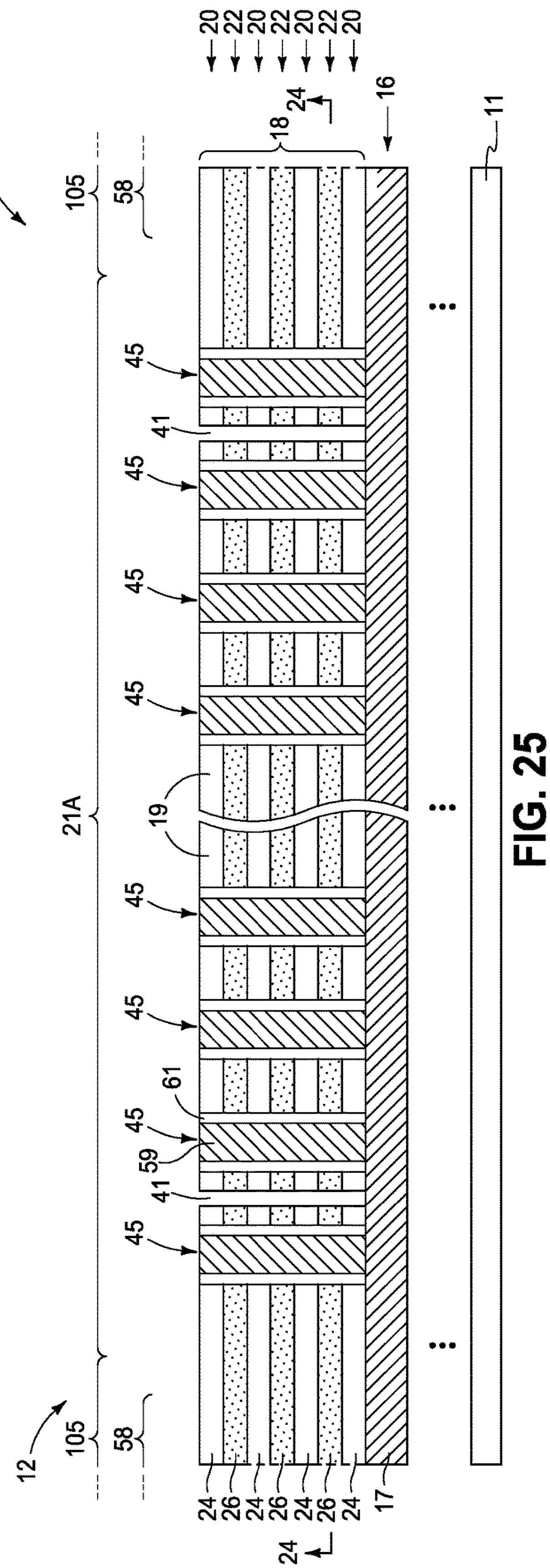
Figure 26:
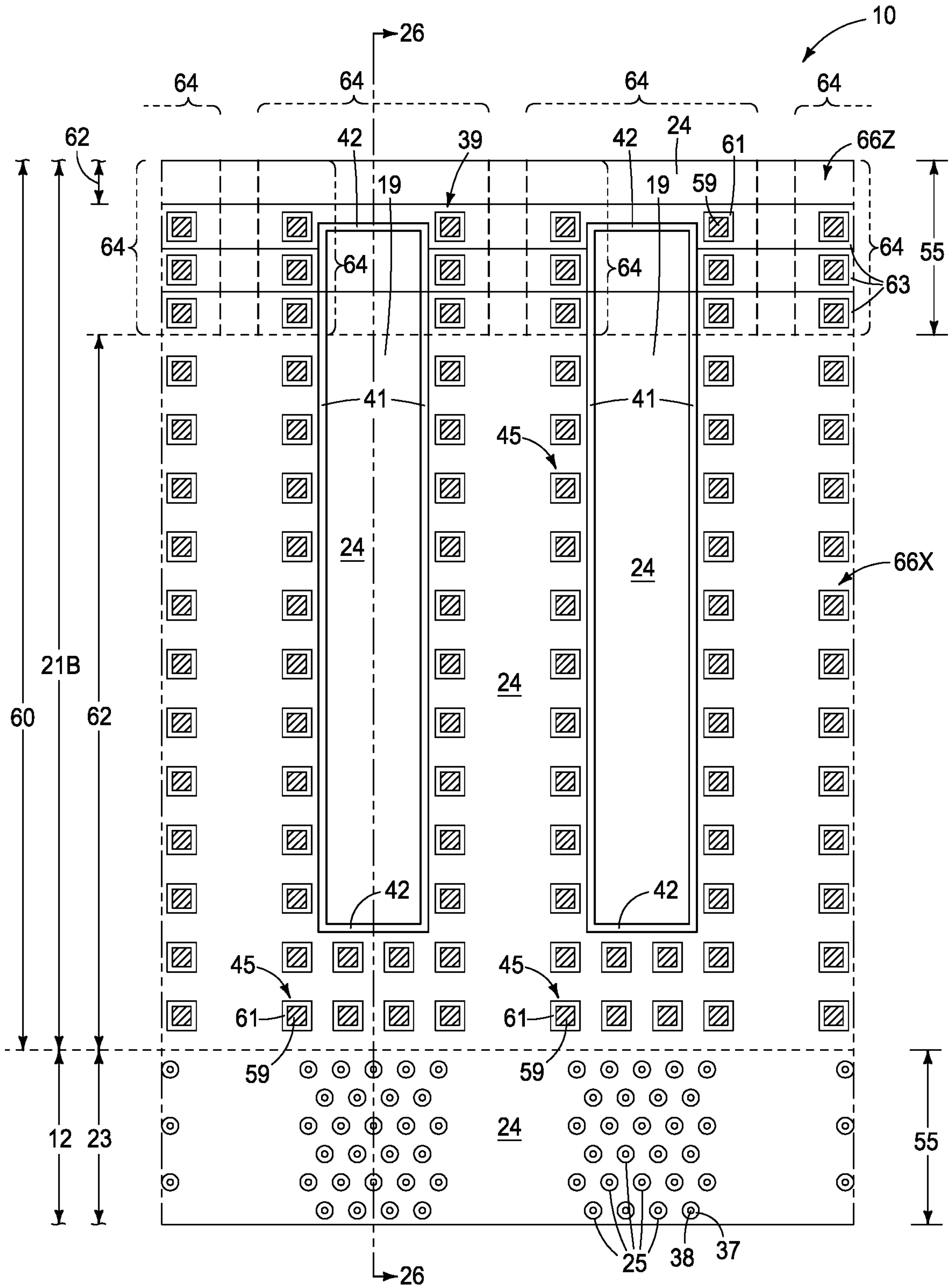
Figure 27:
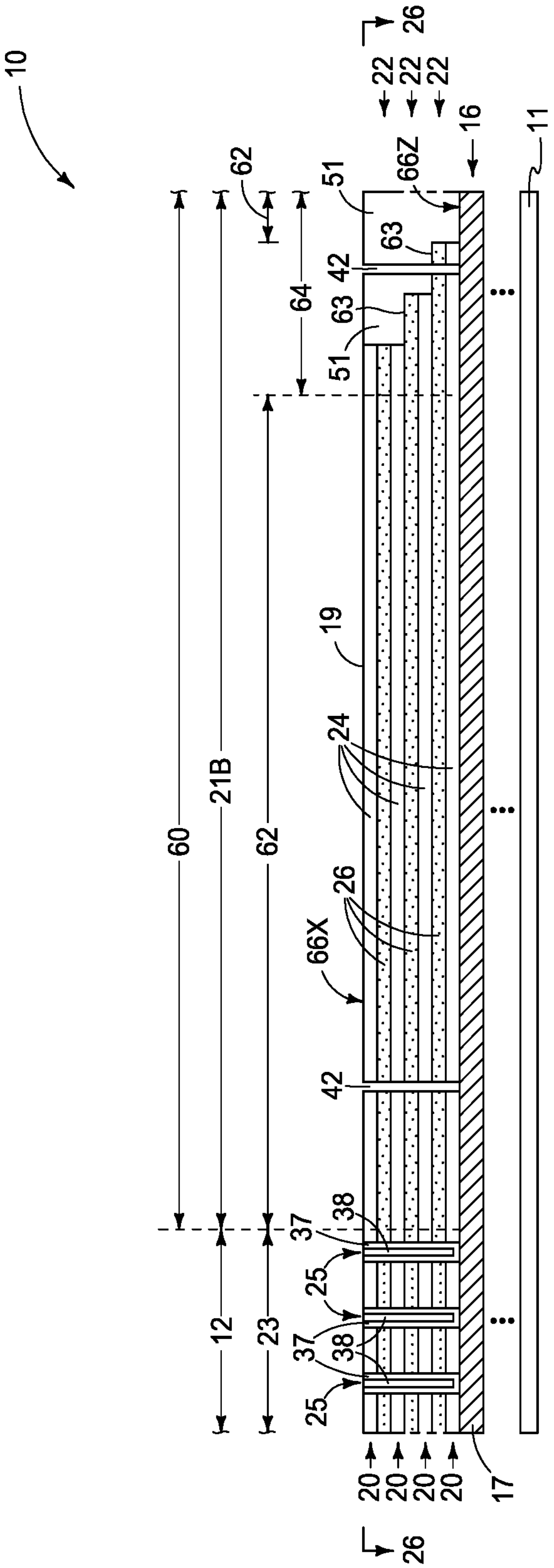
Figure 28:
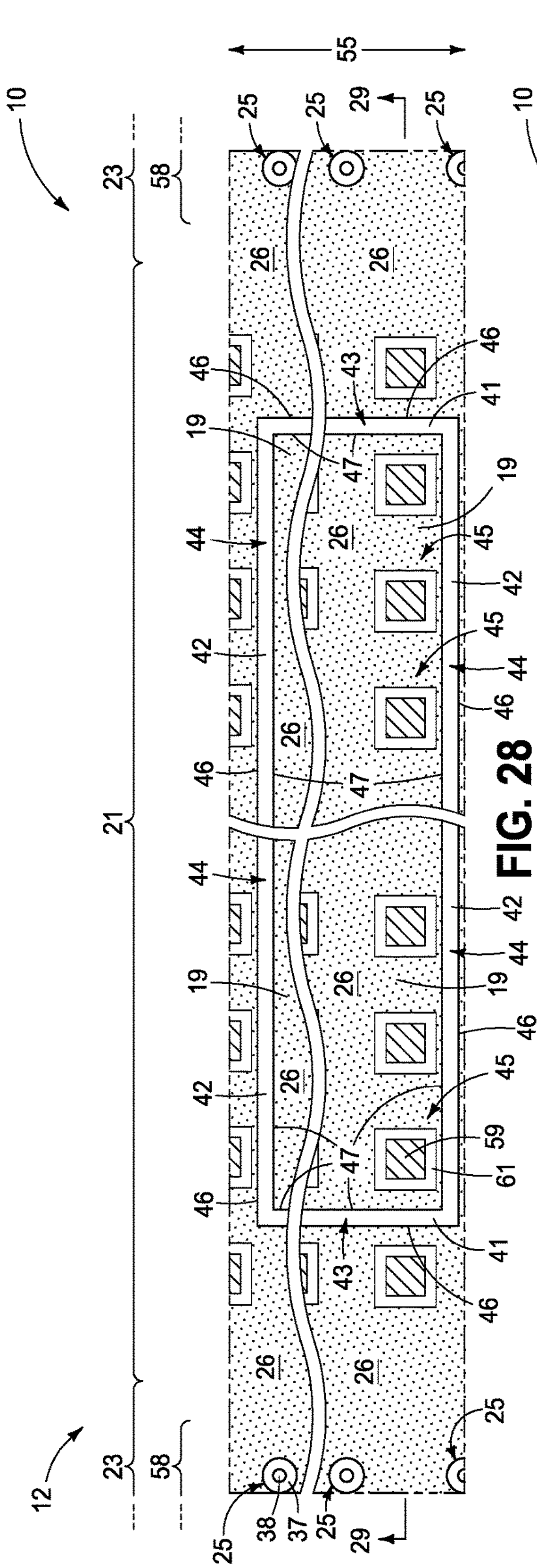
Figure 29:
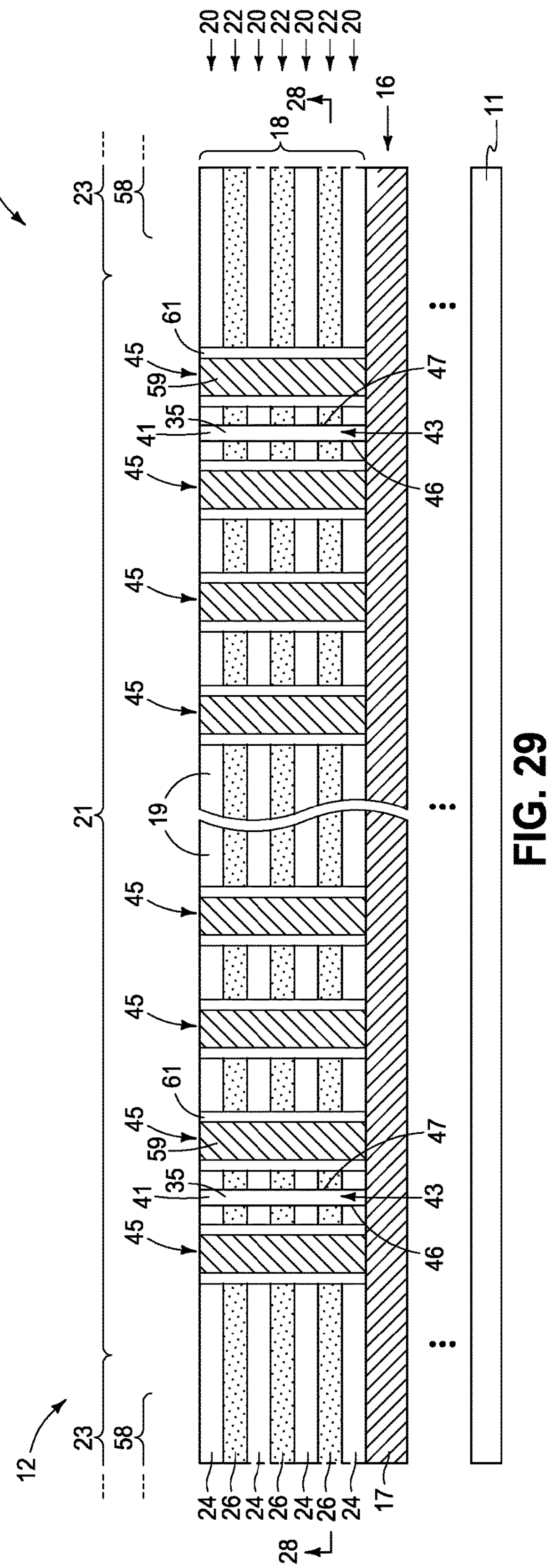
Figure 30:
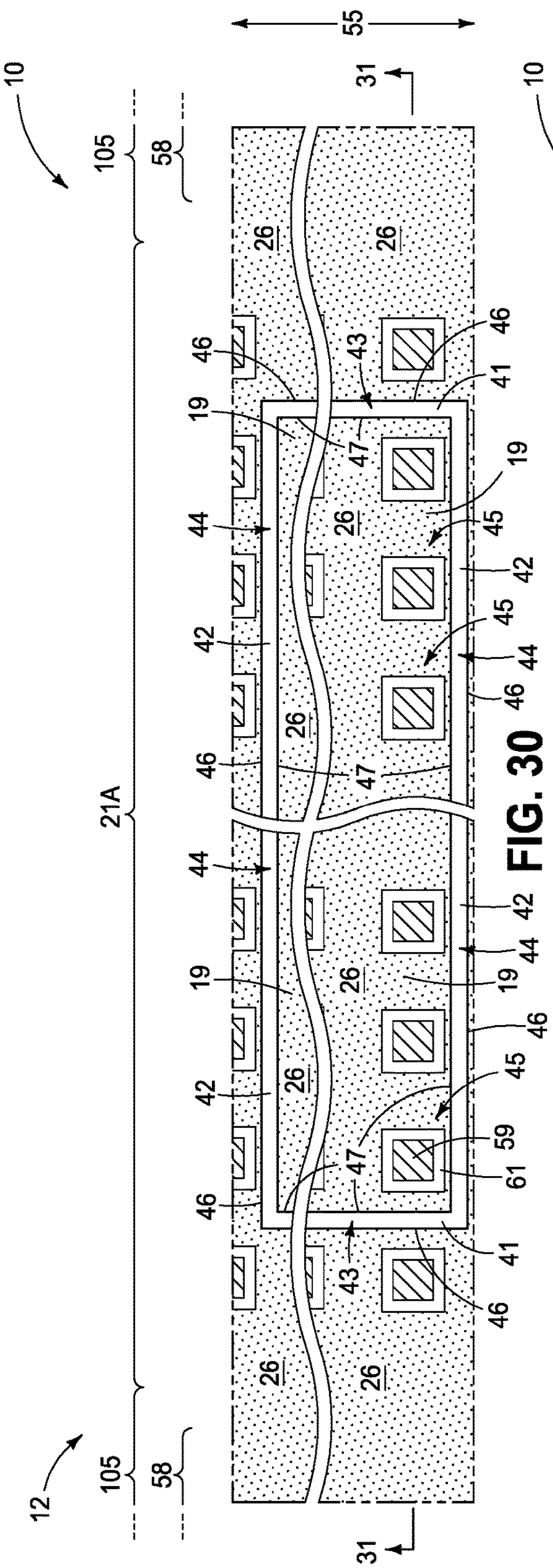
Figure 31:
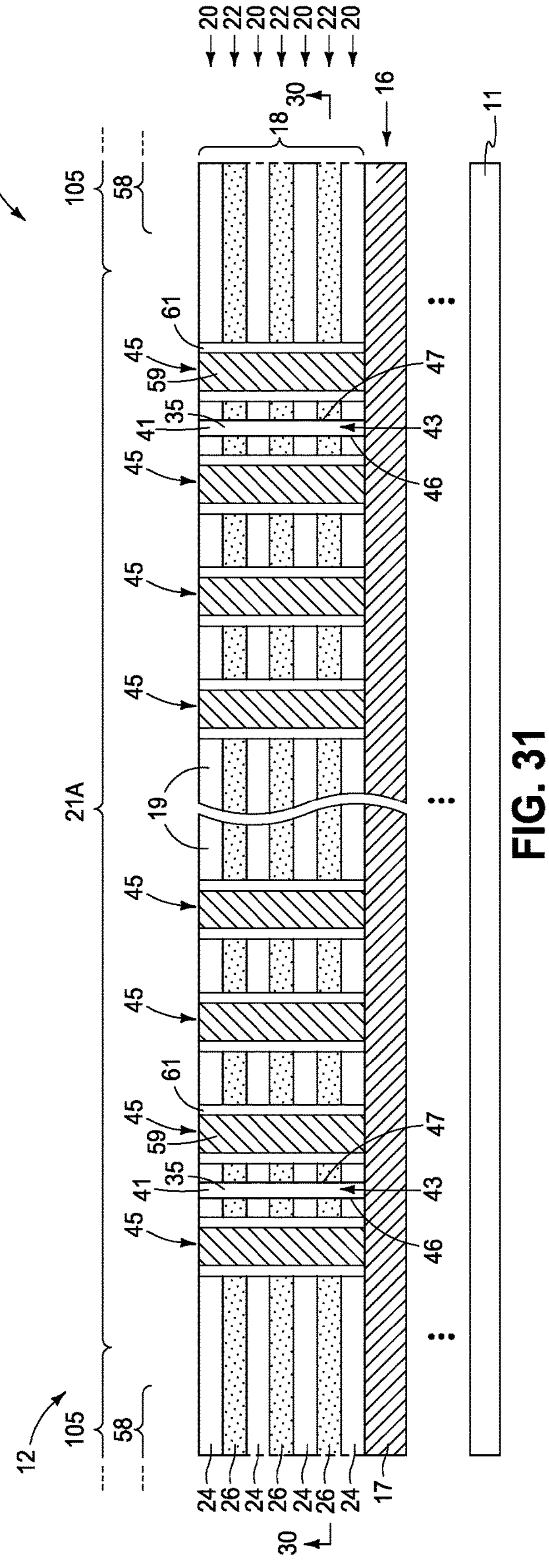
Figure 32:
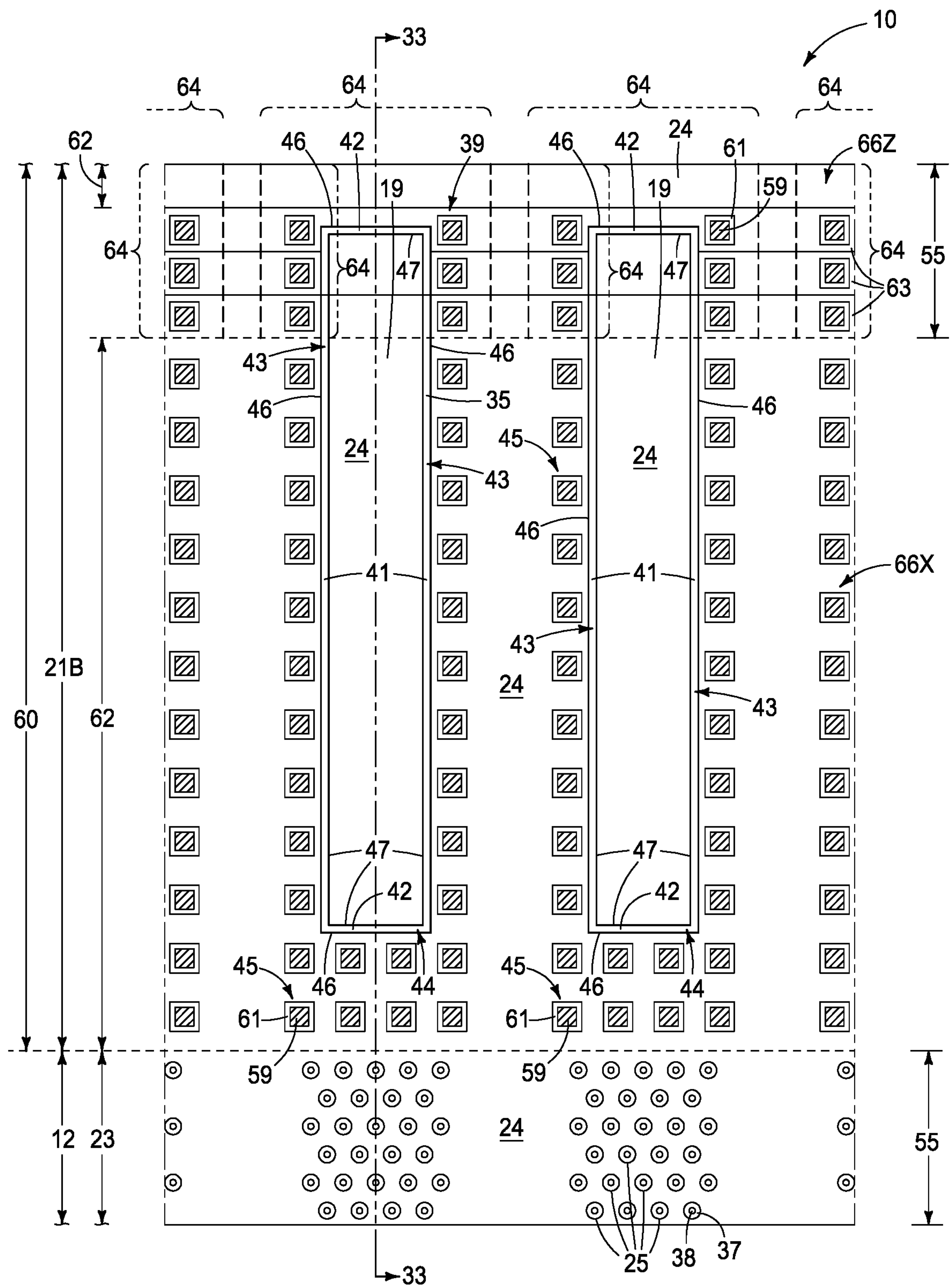
Figure 33:
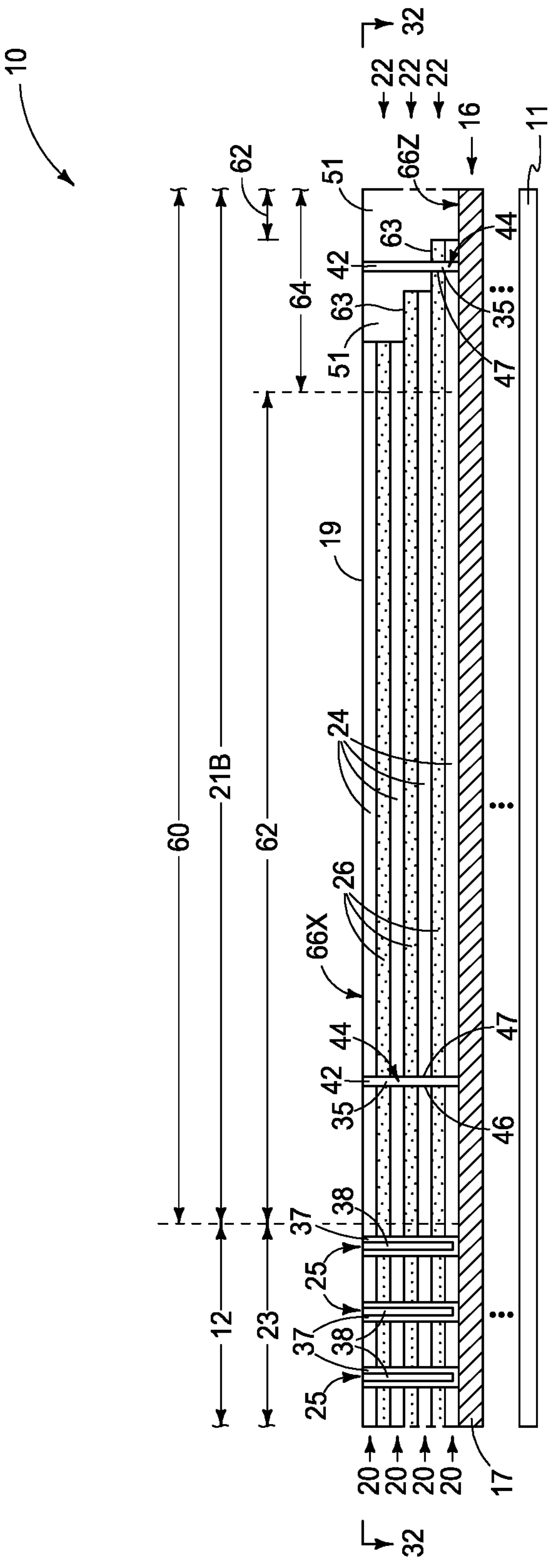
Figure 34:
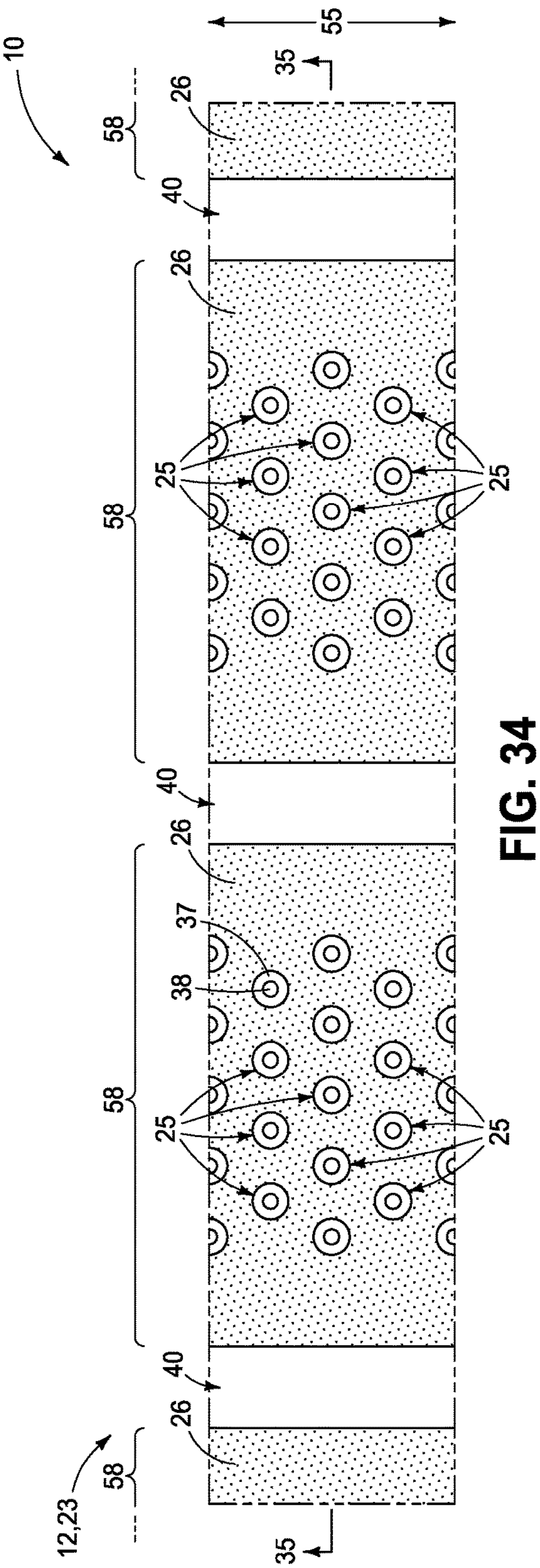
Figure 35:
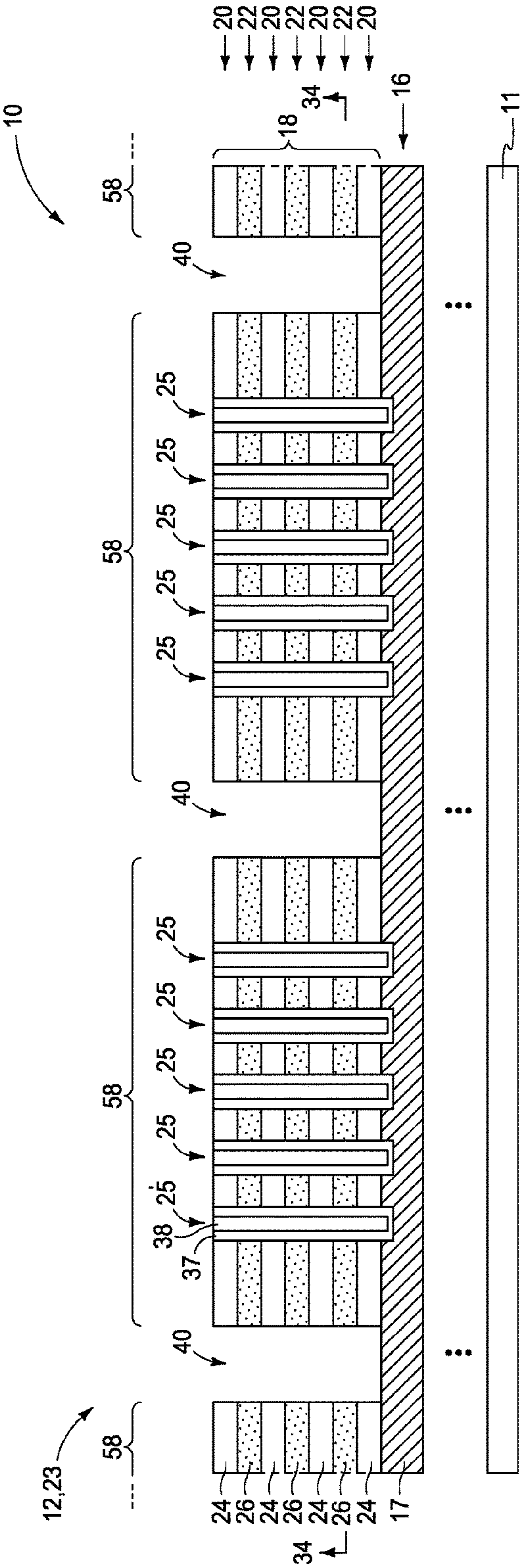
Figure 36:
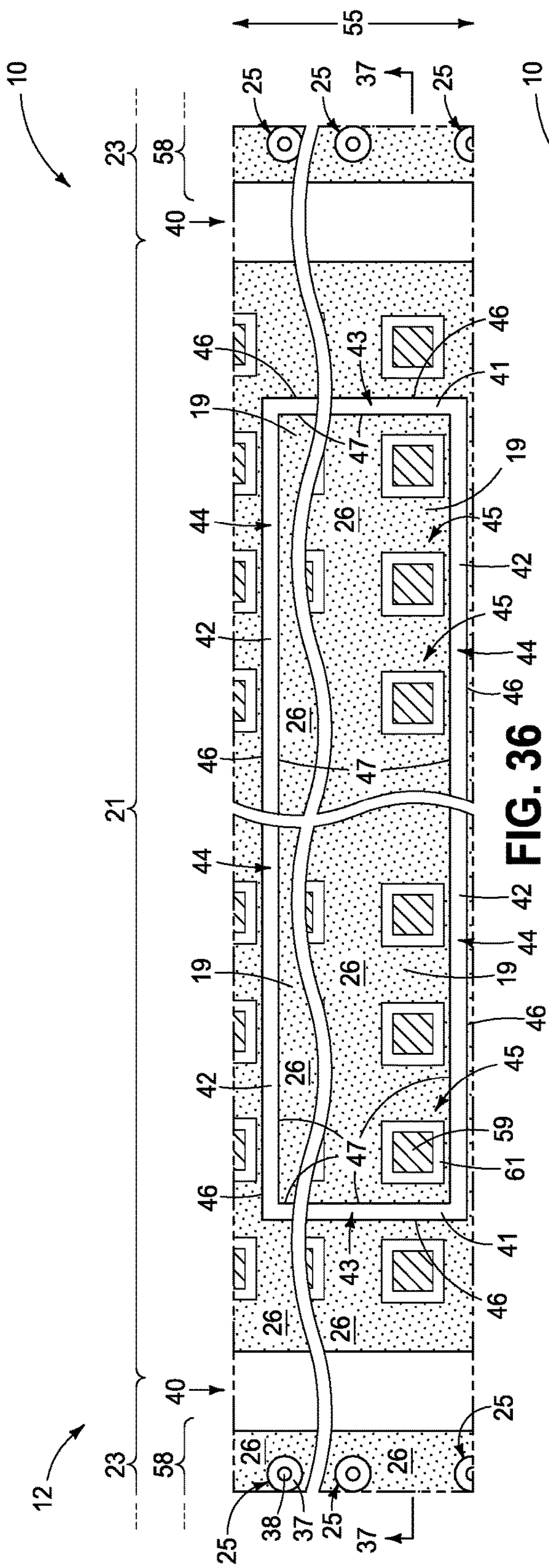
Figure 37:
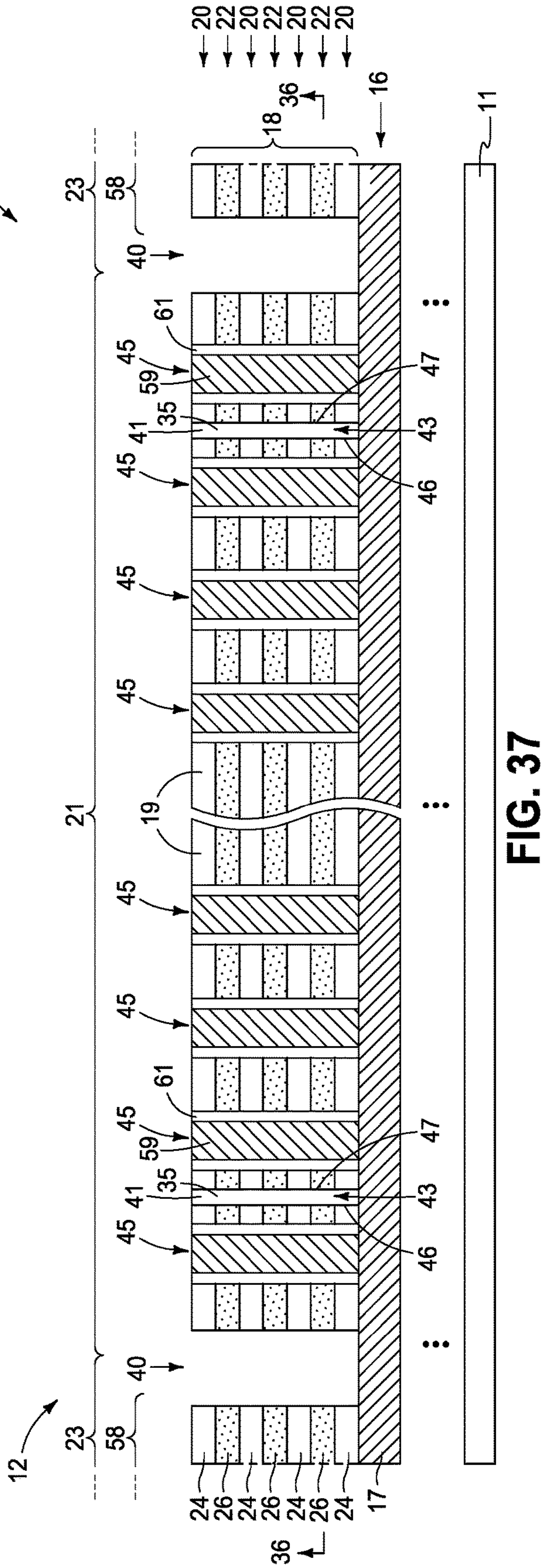
Figure 38:
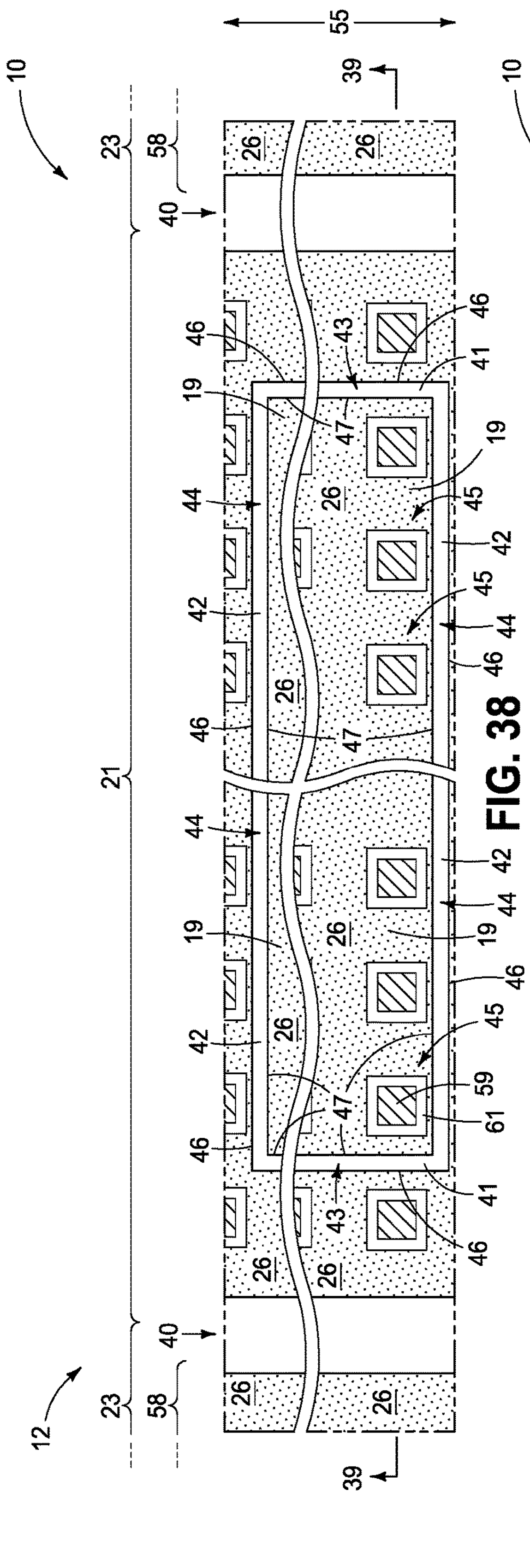
Figure 39:
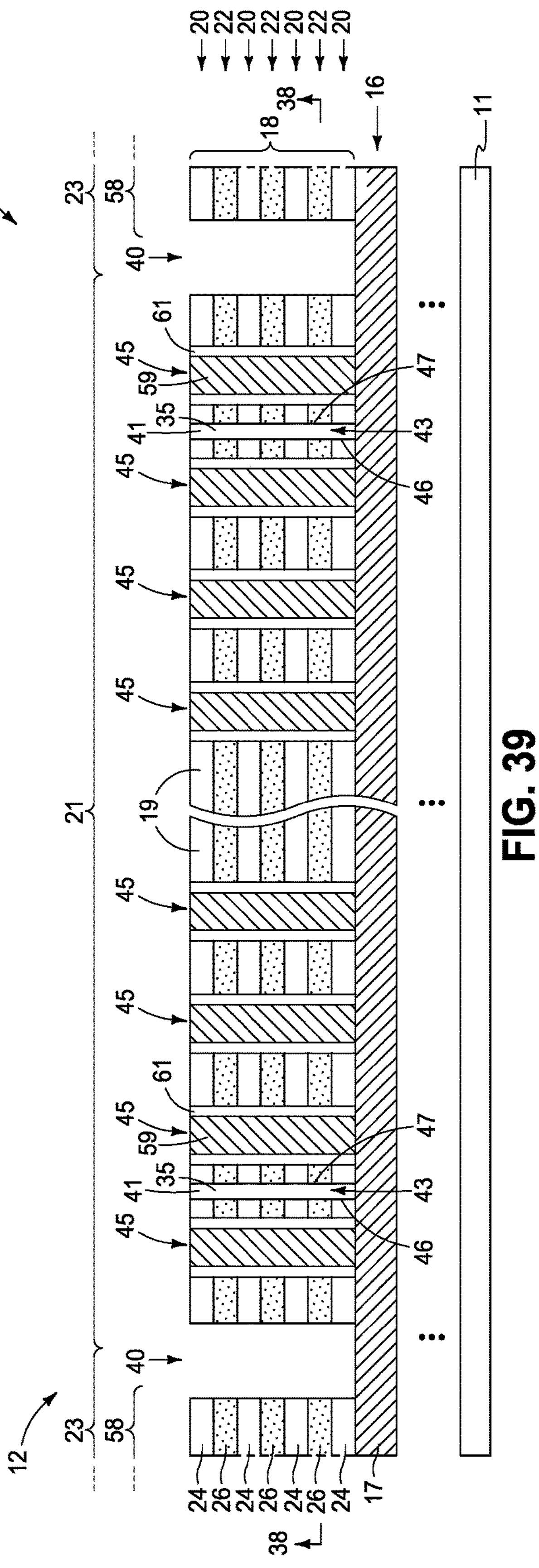
Figure 40:
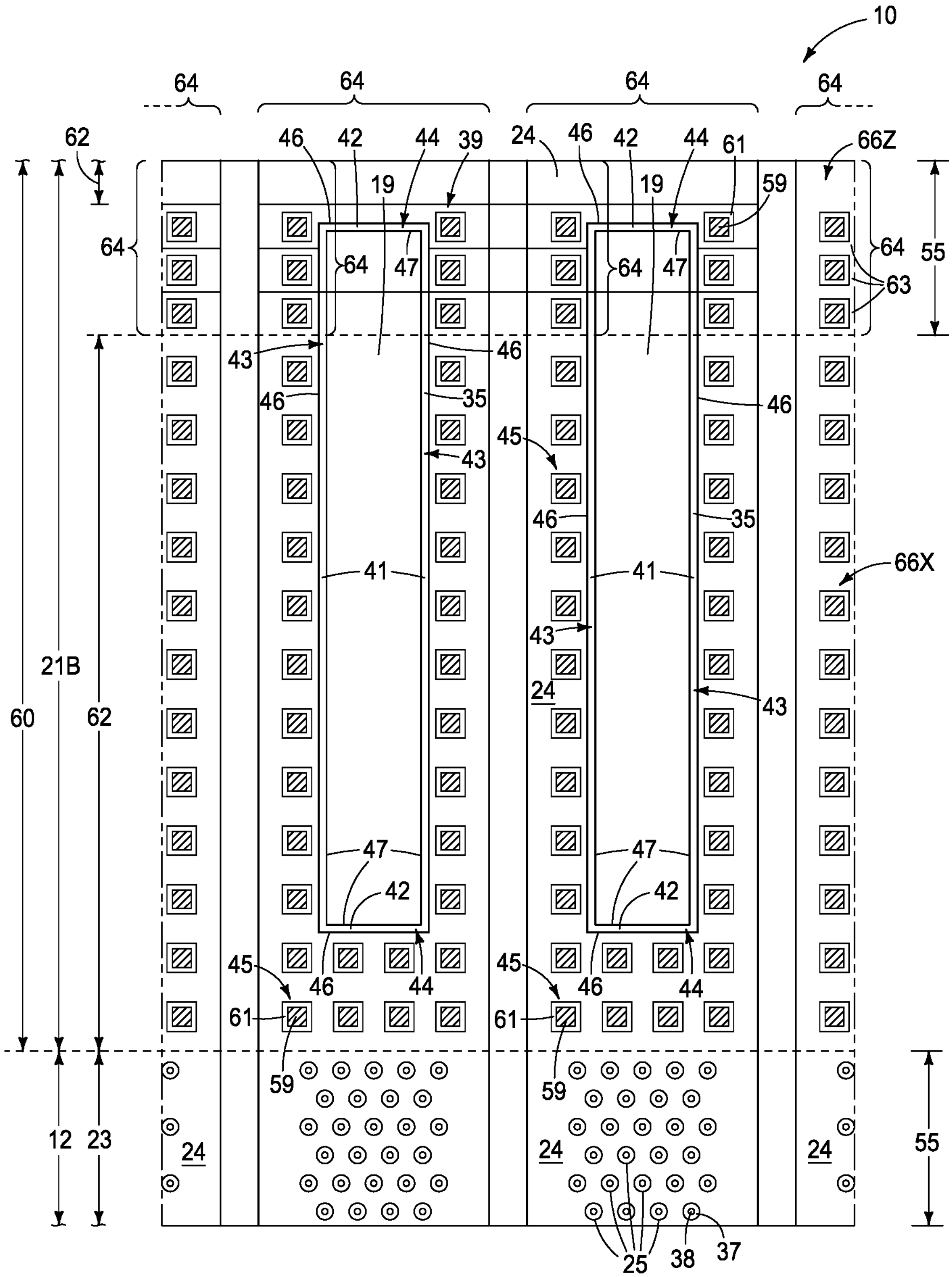
Figure 41:
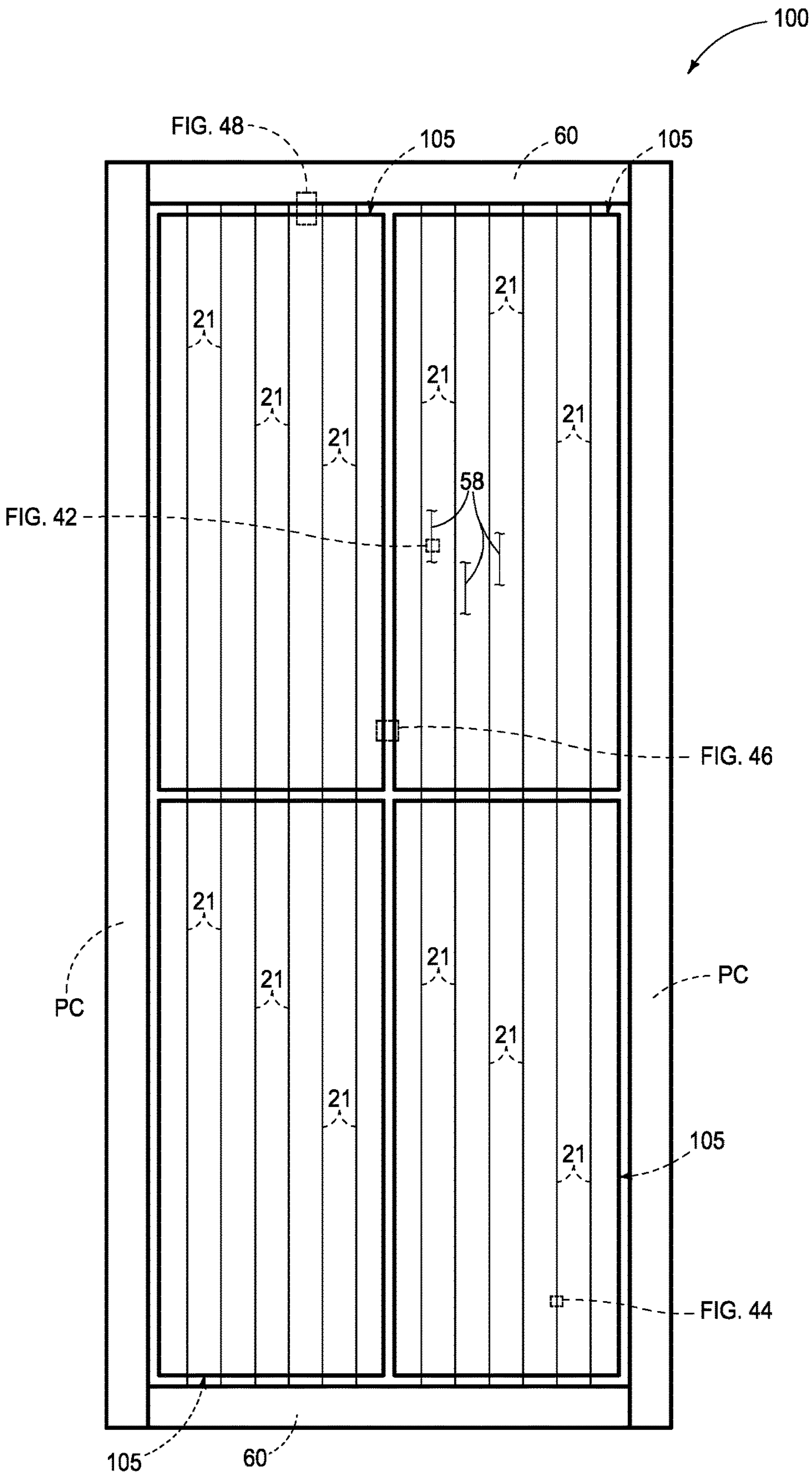
Figure 42:
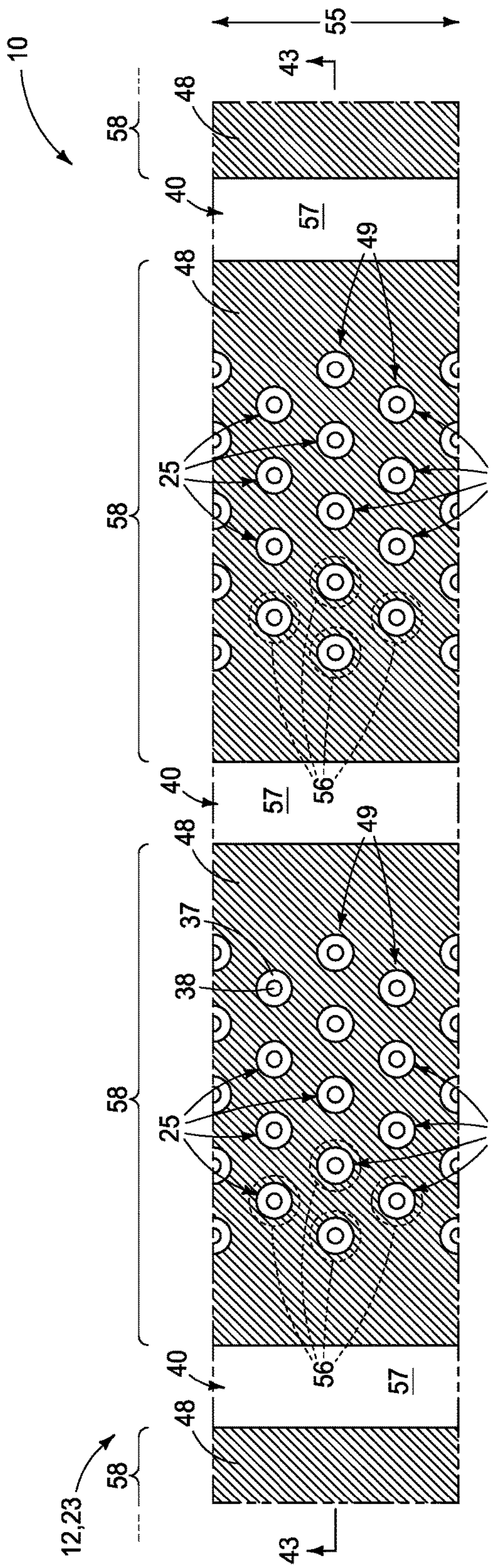
Figure 43:
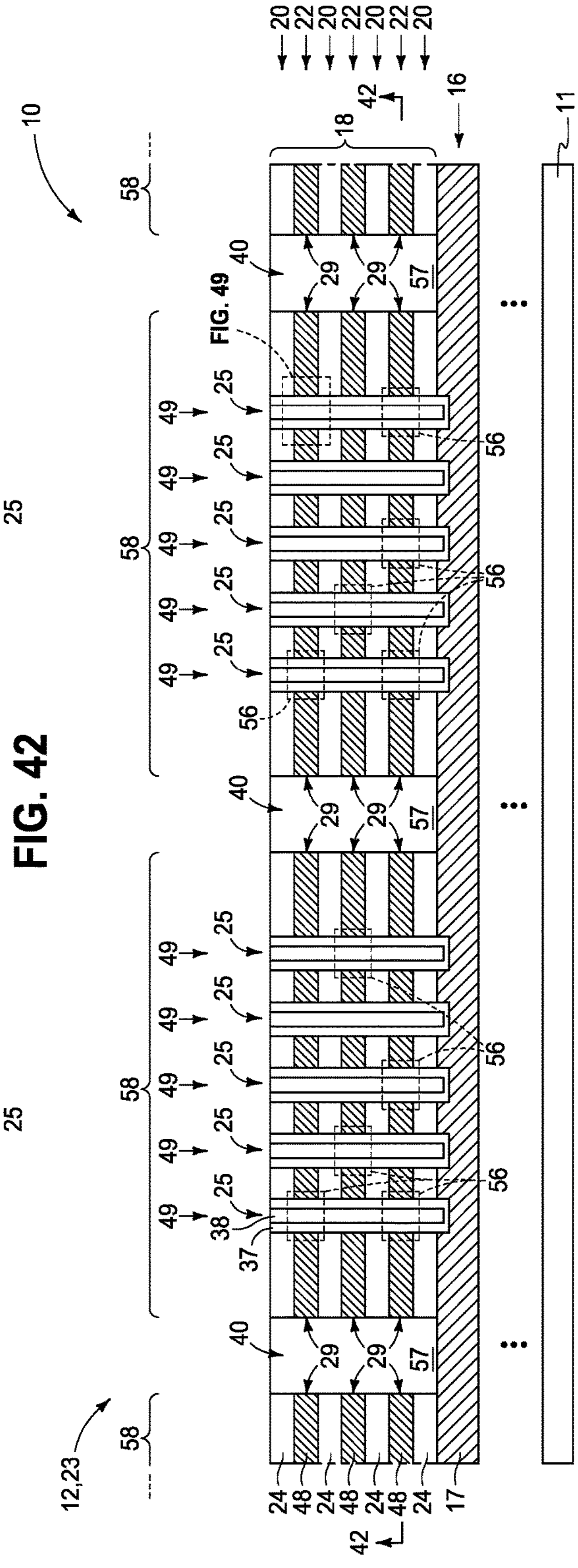
Figure 44:
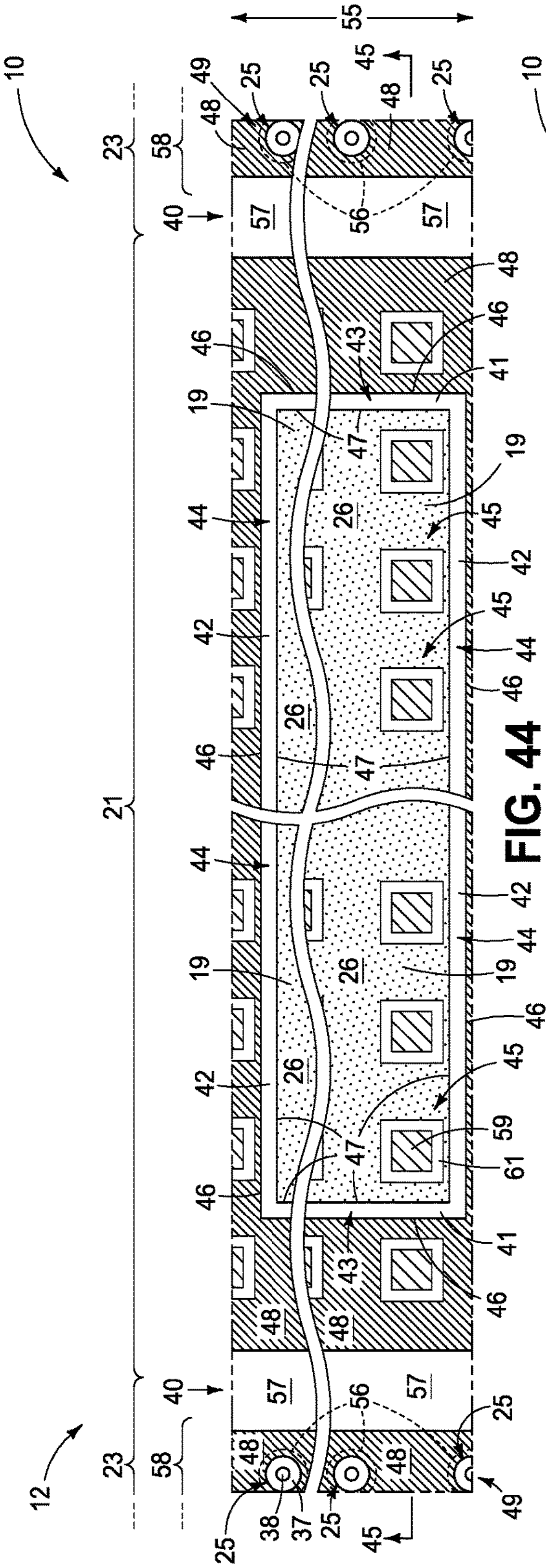
Figure 45:
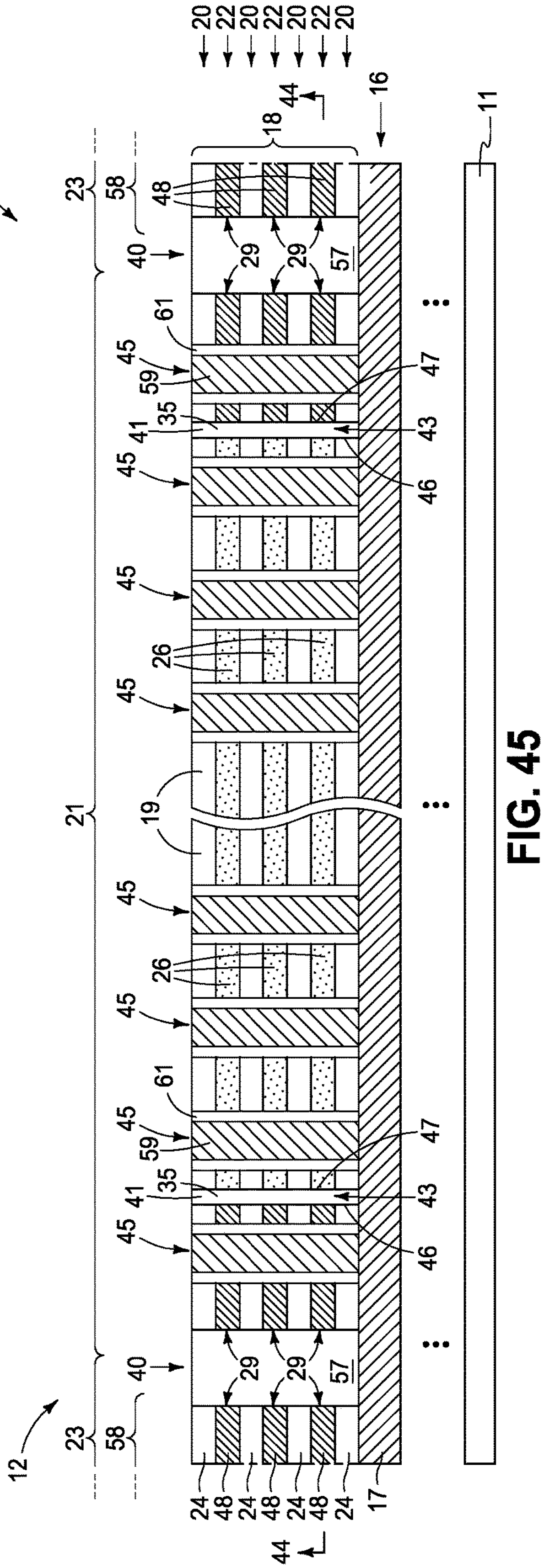
Figure 46:
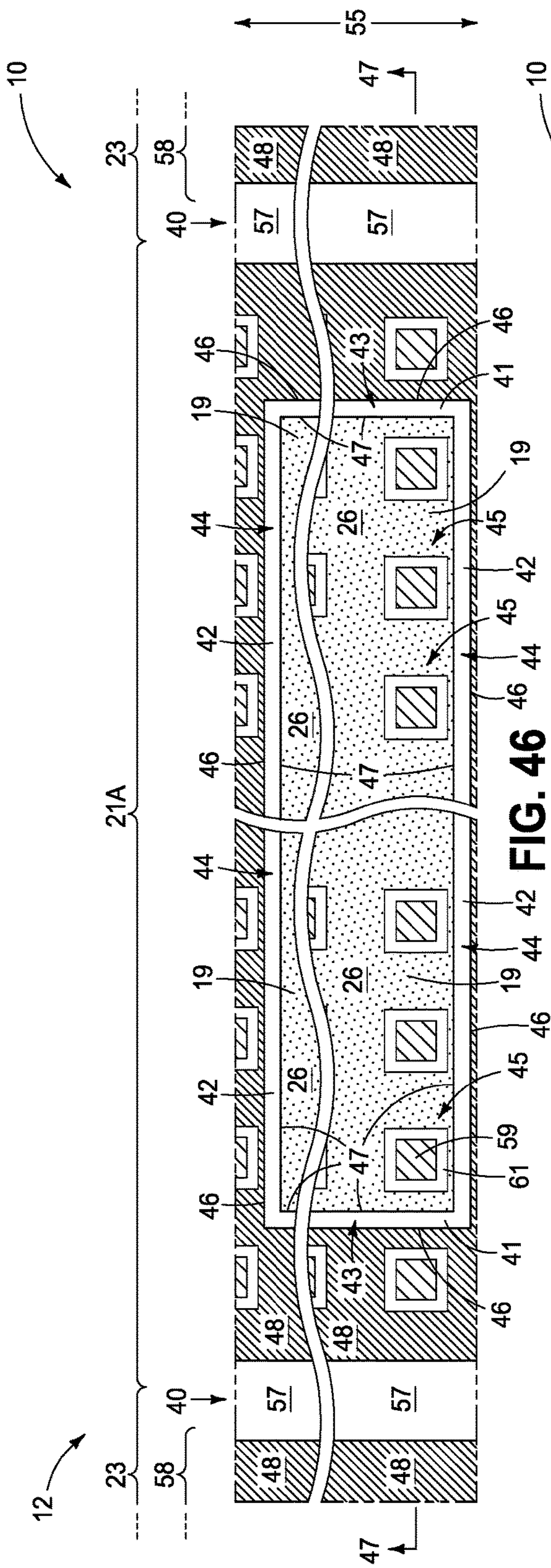
Figure 47:
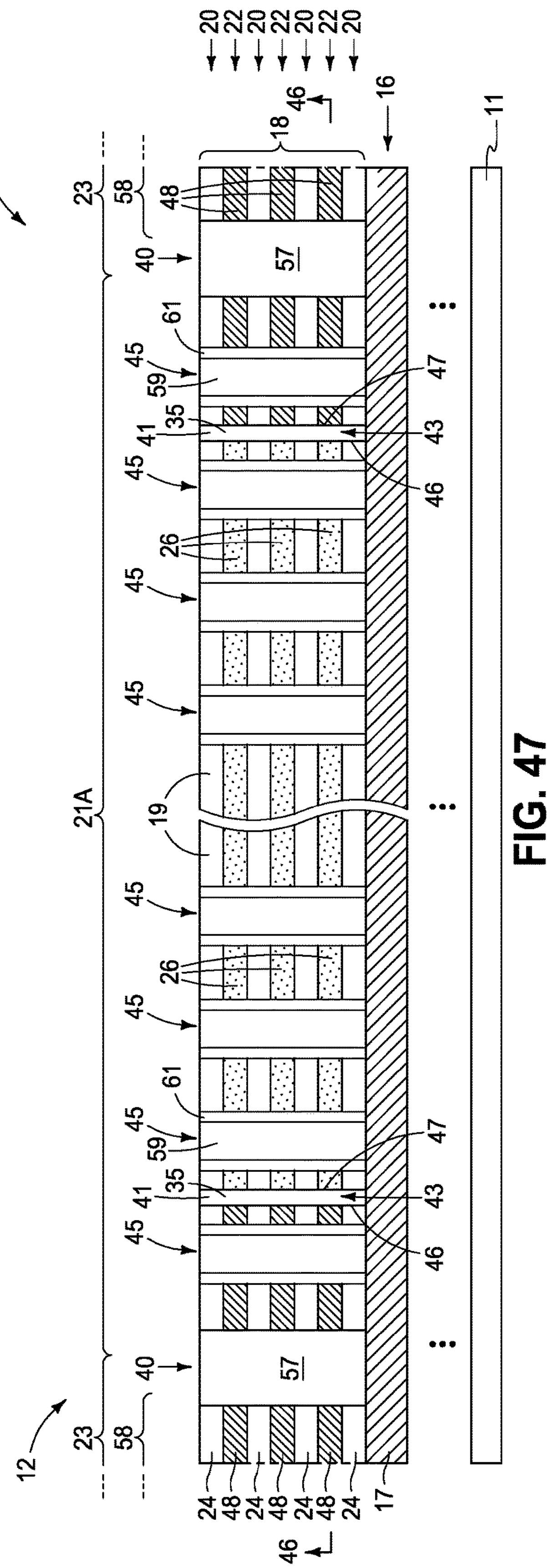

Referring to FIGS. 14 and 15, and in one embodiment, a stair-step structure 64 (e.g., having steps 63) has been formed into stack 18 in stair-step region 60 and a landing (e.g., 66X and/or 66Z, with 66X being a landing crest and 66Z being a landing foot) has been formed in landing region 62 of stair-step region 60. Alternately, no landing 66X may be immediately-adjacent memory-cell-string region 23 (not shown), with for example an uppermost step 63 (not shown) being immediately there-adjacent. Stair-step structure 64 in the example "gate-last" method is circuit-inoperative but will comprise an operative stair-step structure in a finished-circuitry construction. An "operative stair-step structure" is circuit-operative having at least some conductive step thereof that electrically couples with and between a) an electronic component in operative memory-cell-string region 23, such as a transistor and/or memory cell, and b) an electronic component outside of operative memory-cell-string region 23. Such an operative stair-step structure may be formed by any existing or later-developed method(s). As one such example, a masking material (e.g., a photo-imageable material such as photoresist) may be formed atop stack 18 and an opening formed there-through. Then, the masking material may be used as a mask while etching (e.g., anisotropically) through the opening to extend such opening into the outermost two tiers 20, 22. The resultant construction may then be subjected to a successive alternating series of lateral-trimming etches of the masking material followed by etching deeper into stack 18 two-tiers 20, 22 at a time using the trimmed masking material having a successively widened opening as a mask. Such an example may result in the forming of stair-step structure 64 into stack 18 that comprises vertically alternating tiers 20, 22 of different composition materials 24, 26, and in the forming of another stair-step structure (not shown) opposite and facing stair-step structure 64 (e.g., in mirror image). Such opposite stair-step structure (not shown) may be a dummy stair-step structure. A "dummy stair-step structure" is circuit-inoperative having steps thereof in which no current flows in conductive material of the steps and which may be a circuit-inoperable dead end that is not part of a current flow path of a circuit even if extending to or from an electronic component. Multiple operative stair-step structures (not shown) and multiple dummy stair-step structures (not shown) may be formed, for example longitudinally end-to-end in different portions of stair-step region 60 and to different depths within stack 18 (not shown). Pairs of opposing mirror-image operative and dummy stair-step structures may be considered as defining a stadium (e.g., a vertically recessed portion having opposing flights of stairs, and not shown).

Referring to FIGS. 16-21, operative TAVs 45 have been formed in one or more of regions 21, 21A, and 21B. One or more circuit-operative conductive vias 39 may also be formed to each step 63. Insulative material 51 (e.g., silicon dioxide) may be formed atop stair-step structure 64 prior to forming operative TAVs 45 and vias 39. Example operative TAVs 45 and vias 39 are shown as comprising a conductive-material core 59 surrounded by insulative material 61 (e.g., silicon dioxide and/or silicon nitride). The landing 62 in which at least some of operative TAVs 45 are received may be a crest of what-will-be operative stair-step structures 64 (e.g., landing crest 66X). Additionally, or alternately, the landing in which at least some of the operative TAVs may be received may be a landing foot of what-will-be operative stair-step structure 64 (e.g., landing foot 66Z and not shown).

In one embodiment, an elevationally-extending wall is formed in a memory-plane region laterally-between immediately-laterally-adjacent of the memory-block regions and that completely encircles an island that is laterally-between immediately-laterally-adjacent of the memory-block regions in the memory-plane region. In one embodiment, a pair of elevationally-extending walls are formed that are laterally-spaced relative one another and that are individually horizontally-longitudinally-elongated, with the pair of walls being in a region that is edge-of-plane relative to the memory-plane region.

In one embodiment, an elevationally-extending wall is formed in the memory-plane region laterally-between immediately-laterally-adjacent of the memory-block regions and that completely encircles an island that is laterally-between immediately-laterally-adjacent of the memory-block regions in the memory-plane region.

In one embodiment, the horizontally-elongated trenches are formed into the stack to form the laterally-spaced memory-block regions to extend from the memory-array region into the stair-step region, with the memory-block regions in the stair-step region comprising laterally-spaced stair-step-structure regions. A pair of elevationally-extending walls are formed in the laterally-spaced stair-step-structure regions and that are spaced laterally-inward from sides of the respective stair-step-structure region, that are laterally-spaced relative one another, and that are individually horizontally-longitudinally-elongated. The stair-step-structure regions are formed to comprise at least one of (a), (b), and (c), where:

- (a): the individual stair-step-structure regions being devoid of operative TAV's laterally-between the pair of walls;
- (b): at least one of the walls neither being horizontally parallel horizontal-longitudinal-orientation of its individual stair-step structure region nor angled orthogonally relative said horizontal-longitudinal-orientation; and
- (c): the individual stair-step-structure regions being devoid of any interconnecting wall that extends laterally between the pair of walls.

In one embodiment, the stair-step structure regions are formed to comprise only one of (a), (b), and (c); in one embodiment to comprise two of (a), (b), and (c) [in one such embodiment only two of (a), (b), and (c)]; and in one embodiment all three of (a), (b), and (c) [as is shown and described below].

Any such elevationally-extending wall(s) may be formed, by way of example, within an elevationally-extending trench the longitudinal and lateral extent of such that may define the shape, size, and orientation of such wall(s). Alternately, any such elevationally-extending wall(s) may be formed by other existing or future-developed manners.

As an example, and referring to FIGS. 22-27, a pair of elevationally-extending wall openings 41 (e.g., trenches) have been formed that are laterally-spaced relative one another and that are individually horizontally-longitudinally-elongated. In one embodiment, pair of wall openings 41 is in region 21A that is edge-of-plane relative to memory-plane region(s) 105 (e.g., FIGS. 24, 25). In one embodiment, pair of wall openings 41 is in a memory-plane region 105 laterally-between immediately-laterally-adjacent memory-block regions 58 (e.g., FIGS. 22, 23 and in region 21). In one embodiment, pair of wall openings 41 is in laterally-spaced stair-step-structure regions 64 (e.g., FIGS. 26, 27), with wall openings being spaced laterally-inward from sides of the respective stair-step-structure region, being laterally-spaced relative one another, and being individually horizontally-longitudinally-elongated.

In one embodiment and as shown, more elevationally-extending wall openings 42 (e.g., that may include another pair of wall openings) have been formed that connect with pair of wall openings 41, with wall openings 41 and 42 collectively completely-encircling an island 19 that includes space between laterally-spaced wall openings 41. Such may be in any one, two, or all three of the respective regions 21, 21A, and 60, with all three being shown. Regardless, in one embodiment, island 19 is longitudinally-elongated along pair of wall openings 41. In one embodiment, at least one of wall openings 41 in region 21A is horizontally parallel a straight-line edge of region 21A. In one embodiment, wall openings 41 are horizontally parallel relative one another and in one embodiment wall openings 42 are horizontally parallel relative one another. In one embodiment where wall openings 42 are also formed, wall openings 41 and 42 are formed at the same time. Wall openings 41 and/or 42 may be formed at the same time as forming channel openings 25, by way of example, and as is analogously disclosed in U.S. Pat. No. 10,014,309.

Referring to FIGS. 28-33, material 35 has been formed in wall openings 41 and 42, thereby forming walls 43 and 44 in wall openings 41 and 42, respectively, in one embodiment. Walls 43 and/or 44 may of course have any of the attributes described above and/or shown in the drawings with respect to wall openings 41 and 42, respectively, and regardless of whether wall openings were used to form walls 43 and/or 44. Walls 43 and 44 may be considered as having first and second sides 46 and 47, respectively. In one embodiment, walls 43 and 44 may collectively be considered as an elevationally-extending wall 43/44 in a memory-plane region 105 laterally-between immediately-adjacent memory-block regions 58 (e.g., FIGS. 28, 29) and that completely encircles an island 19 that is laterally-between immediately-laterally-adjacent memory-block regions 58 in the memory-plane region 105. In one embodiment, wall 43/44 completely encircles an island 19 that includes space between laterally-spaced walls 43 and is edge-of-plane (e.g., FIGS. 30, 31). In one embodiment, wall 43/44 completely encircles an island 19 that includes space between the laterally-spaced walls 43 in a stair-step region 60 (e.g., FIGS. 32, 33). Example materials 35 include insulative materials such as silicon dioxide and silicon nitride, as well as channel material and/or charge-storage material as disclosed in U.S. Pat. No. 10,014,309 and regardless of when formed. At least some conductive material may be used as material 35 as long as such does not provide a conductive shorting connection between any vertically-spaced conductive tiers 22 in a finished-circuitry construction (assuming walls 43 and/or 44 remain in the finished-circuitry construction).

Referring to FIGS. 34-40, horizontally-elongated trenches 40 have been formed (e.g., by anisotropic etching) into stack 18 to form laterally-spaced memory-block regions 58 that are part of individual memory-plane regions 105 and that extend from the memory-array region 12 into stair-step region 60 and to form stair-step structures 64 therein. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown). Trenches 40 may be of the same width as that/those of walls 43 and/or 44 (not shown) or may be of different width from that/those of walls 43 and/or 44 (as shown, with example trenches 40 being wider than walls 43 and 44). The above processing shows forming and filling channel openings 25 prior to forming trenches 40. Such could be reversed. Alternately, trenches 40 could be formed in between the forming and filling of channel openings 25 (not ideal).

Referring to FIGS. 41-50, and in one embodiment, material 26 (not shown) of conductive tiers 22 laterally and/or radially outward of wall 43, wall 44, and/or combined wall 43/44 has been removed, for example by being isotropically etched away through trenches 40 ideally selectively relative to the other exposed materials (e.g., using liquid or vapor $H_3PO_4$ as a primary etchant where material 26 is silicon nitride, and other materials comprise one or more oxides or polysilicon). Wall 43, wall 44, and/or combined wall 43/44 during such example isotropic etching restrict(s) lateral access of etching fluid from passing from first side 46 of wall(s) 43, wall(s) 44, and/or combined wall 43/44 to second side 47. Ideally, the example isotropic etching is conducted selectively relative to at least some material of the wall(s), although not necessarily so. For example, and by way of example only, the wall might be made of some material that is etched by the etchant although be sufficiently laterally thick to preclude etchant from passing from first side 46 to second side 47, with the wall itself thereby being laterally etched although not necessarily completely there-through. Accordingly, and regardless, the wall may be laterally etched at least somewhat by the etchant.

Material 26 in conductive tiers 22 in the example embodiment is sacrificial and has been replaced with conducting material 48, and which has thereafter been removed from trenches 40 thus forming individual conductive lines 29 (e.g., wordlines) and elevationally-extending strings 49 of individual transistors and/or memory cells 56. A material 57 (dielectric and/or silicon-containing such as undoped polysilicon) has subsequently been formed in individual trenches 40. A conductive interconnect line (not shown) would operatively electrically couple individual operative TAVs 45, individual vias 39, and individual operative channel-material strings 53 to other circuitry (not shown) not particularly material to the inventions disclosed herein. A thin insulative liner (e.g., $Al_2O_3$ and not shown) may be formed before forming conducting material 48. Approximate locations of transistors and/or memory cells 56 are indicated with a bracket in FIG. 50 and some with dashed outlines in FIGS. 42-44, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 50) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming trenches 40. Alternately, the conducting material of the conductive tiers may be formed before forming trenches 40 and/or before forming walls 43, 44, and/or 43/44 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Any other attribute(s) or aspect(s) as shown and/or described herein with respect to other embodiments may be used with respect to the above-described embodiments.

The above example embodiments show the material that is between walls 43 as comprising, in a finished construction, stack 18 of materials 24 and 26. Alternately, the material between walls 43 may be some other material, including some conductive material as walls 43 and/or 44 preclude vertically-spaced conductive tiers 22 laterally outward of walls 43 and/or 44 from being shorted by such conductive material. Regardless, stack 18 of materials 24, 26 may be removed and replaced with such other material. A non-limiting reason for doing so would be to better match intrinsic material stress within memory-cell-string region 23 as compared to other regions that are outward thereof. For example, memory-cell-string regions 23 likely contain considerably more conducting material 48 than do regions that are outside of memory-cell-string regions 23. This can create a stress imbalance that may lead to cracking at interfaces between memory-cell-string regions 23 and regions outward thereof. For example, memory-cell-string regions 23 may thereby have low or lower intrinsic tensile stress as compared to regions outward thereof. Therefore, the artisan may desire less intrinsic tensile stress/higher intrinsic compressive stress in regions that are outward of memory-cell-string regions 23 than occurs by using a combination of materials 24 and 26. Accordingly, by way of example, materials 24 and 26 may be removed and substituted with an alternate material as shown by way of example in FIGS. 51-56 with respect to a construction 10*a*. Like numerals from the above-described embodiments have been used where appropriate, with some construction differences being indicated with the suffix "a" or with different numerals. Construction 10*a* shows material 70 making up one or more island(s) 19 (all islands 19 as shown) as opposed to a combination of materials 24 and 26 (not shown) in the above-described and shown embodiments. Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

Embodiments of the invention include a memory array (or memory array region, e.g., 12) comprising strings of memory cells (e.g., 49). Such embodiments comprise laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of memory cells (e.g., 56) extend through the insulative tiers and the conductive tiers.

In one embodiment, an elevationally-extending wall (e.g., 43/44) is in the memory plane (e.g., 105, FIGS. 41, 44, 45) laterally-between immediately-laterally-adjacent of the memory blocks (e.g., 58) and that completely encircles an island (e.g., 19) that is laterally-between immediately-laterally-adjacent of the memory blocks in the memory plane. Any other attribute(s) or aspect(s) as shown and/or described herein with respect to other embodiments may be used.

Yet, in another one such embodiment, a pair of elevationally-extending walls (e.g., 43) are laterally-spaced relative one another and are individually horizontally-longitudinally-elongated (e.g., along direction 55, FIGS. 41, 46, 47) and are edge-of-plane. In one such embodiment, more elevationally-extending walls (e.g., 44) that are edge-of-plane are included and connect with the pair of walls (e.g., 43). The pair of walls (e.g., 43) and the more walls (e.g., 44) collectively completely-encircle an island (e.g., 19) that includes space between the laterally-spaced walls (e.g., 43) of the pair of walls (e.g., 43) and is edge-of-plane. Any other attribute(s) or aspect(s) as shown and/or described herein with respect to other embodiments may be used.

Figure 57:
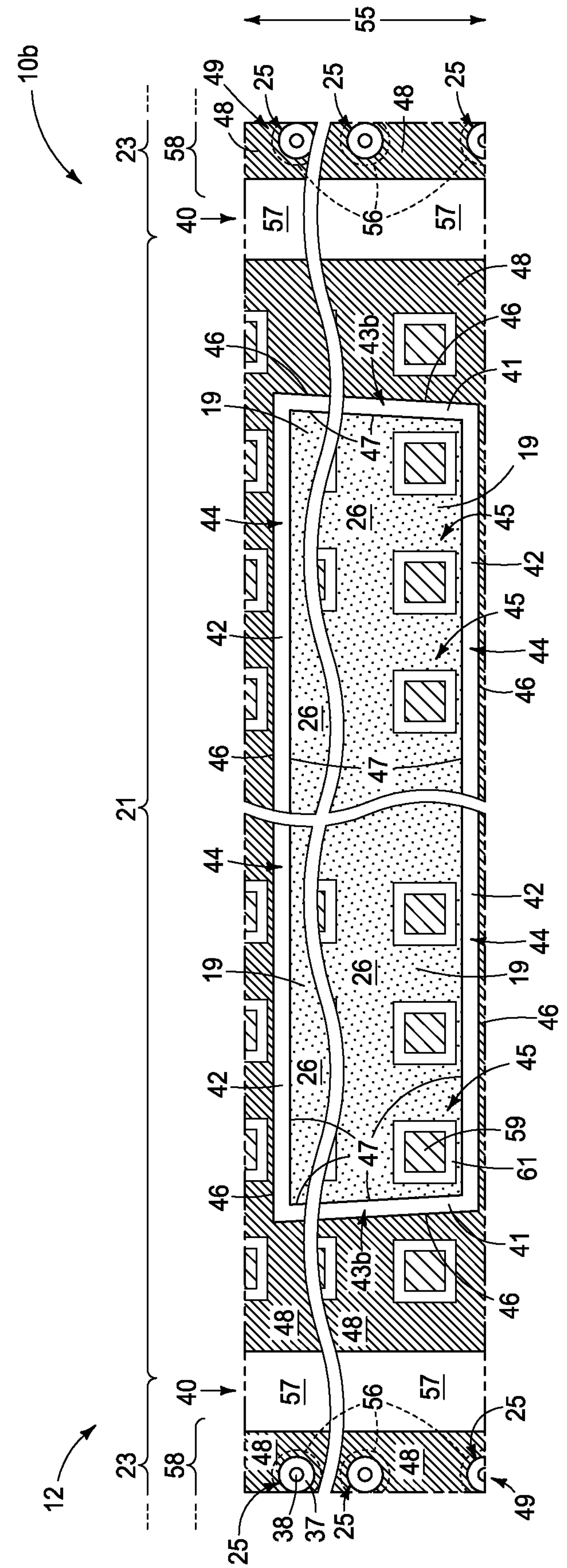

Another such embodiment is shown in FIG. 57 with respect to a construction 10*b*. Like numerals from the above-described embodiments have been used where appropriate, with some construction differences being indicated with the suffix "b". FIG. 57 corresponds to FIG. 44 of the above-described and shown embodiments. Construction 10*b* includes a pair of elevationally-extending walls (e.g., 43*b*) that is in the memory plane (e.g., 105) laterally-between immediately-laterally-adjacent of the memory blocks. The walls are laterally-spaced relative one another and are individually horizontally-longitudinally-elongated (e.g., along direction 55). At least one of the walls (both as shown) is not horizontally parallel horizontal-longitudinal-orientation (e.g., 55) of the immediately-laterally-adjacent memory blocks which the at least one of the walls is laterally-there between. Such may occur with respect to walls 43 in any one or more of the embodiments shown and described with respect to FIGS. 44-49 (not shown). Any other attribute(s) or aspect(s) as shown and/or described herein with respect to other embodiments may be used.

In one embodiment, the insulative tiers and the conductive tiers of the laterally-spaced memory blocks extend from the memory-array region into a stair-step region (e.g., 60) that is adjacent the memory-array region, The insulative tiers and the conductive tiers of the memory blocks in the stair-step region comprise operative stair-step structures (e.g., 64) that are laterally-spaced relative one another and that are individually horizontally-longitudinally-elongated (e.g., along direction 55).

Figure 48:
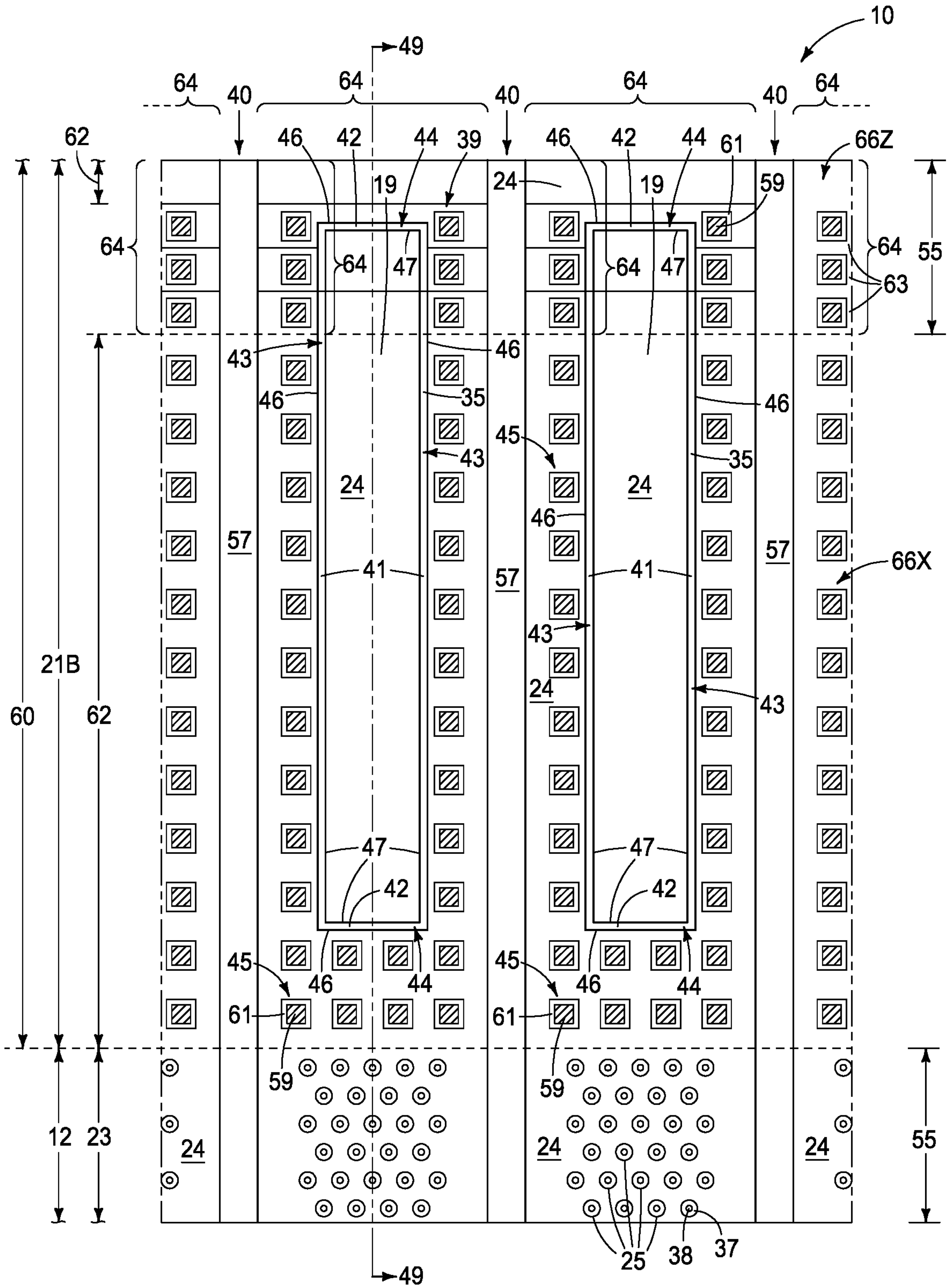
Figure 49:
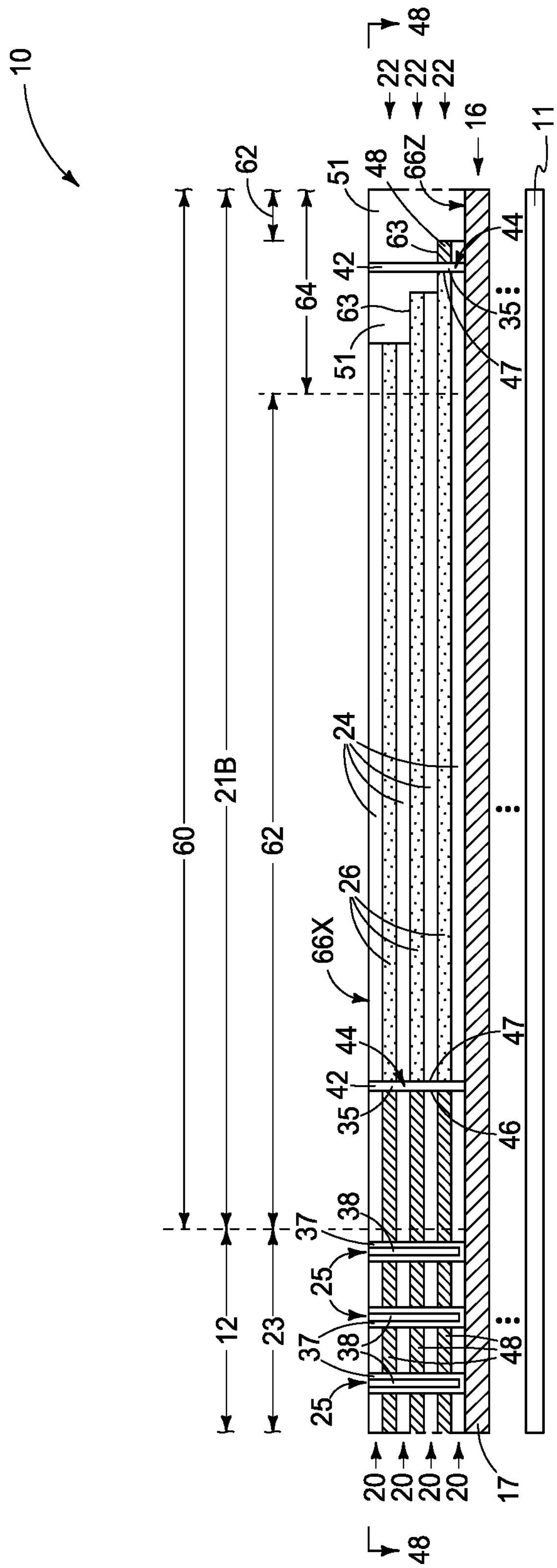
Figure 50:
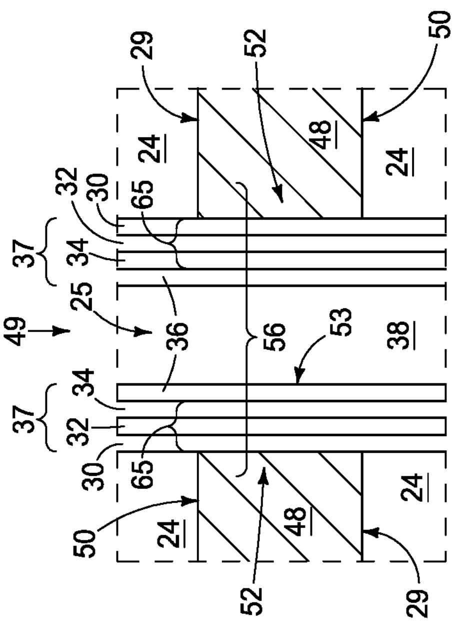
Figure 51:
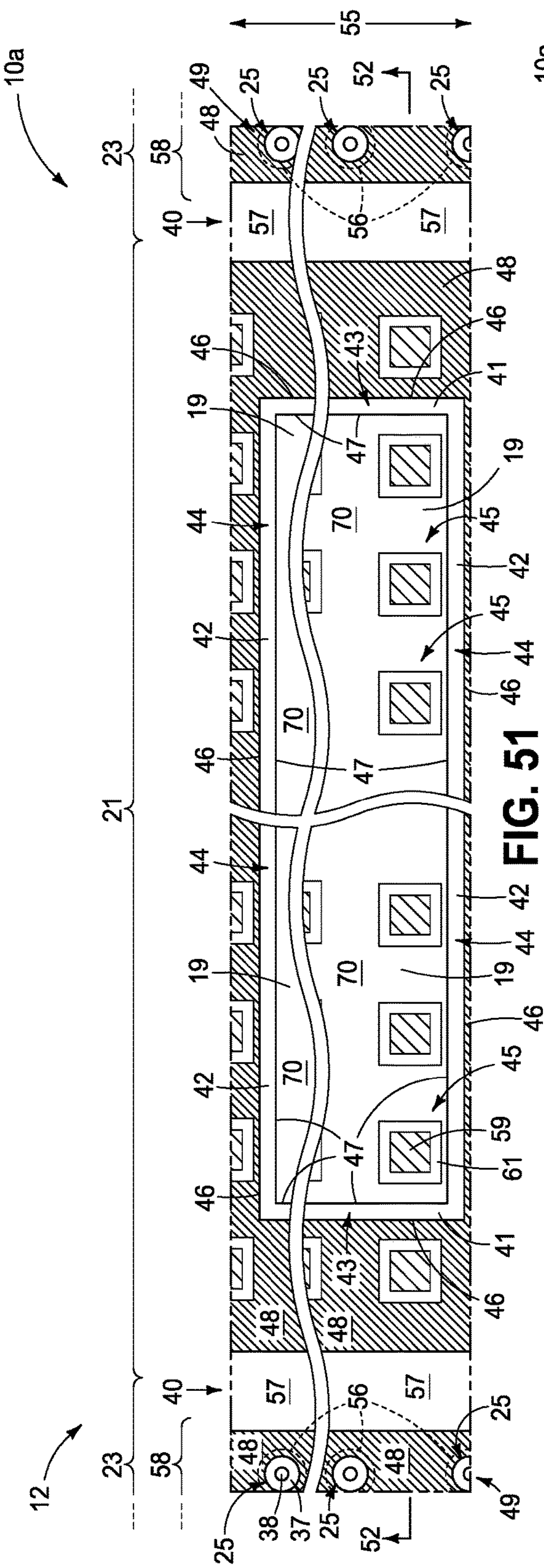
FIGS. 51-59 show alternate and/or additional embodiments.
Figure 52:
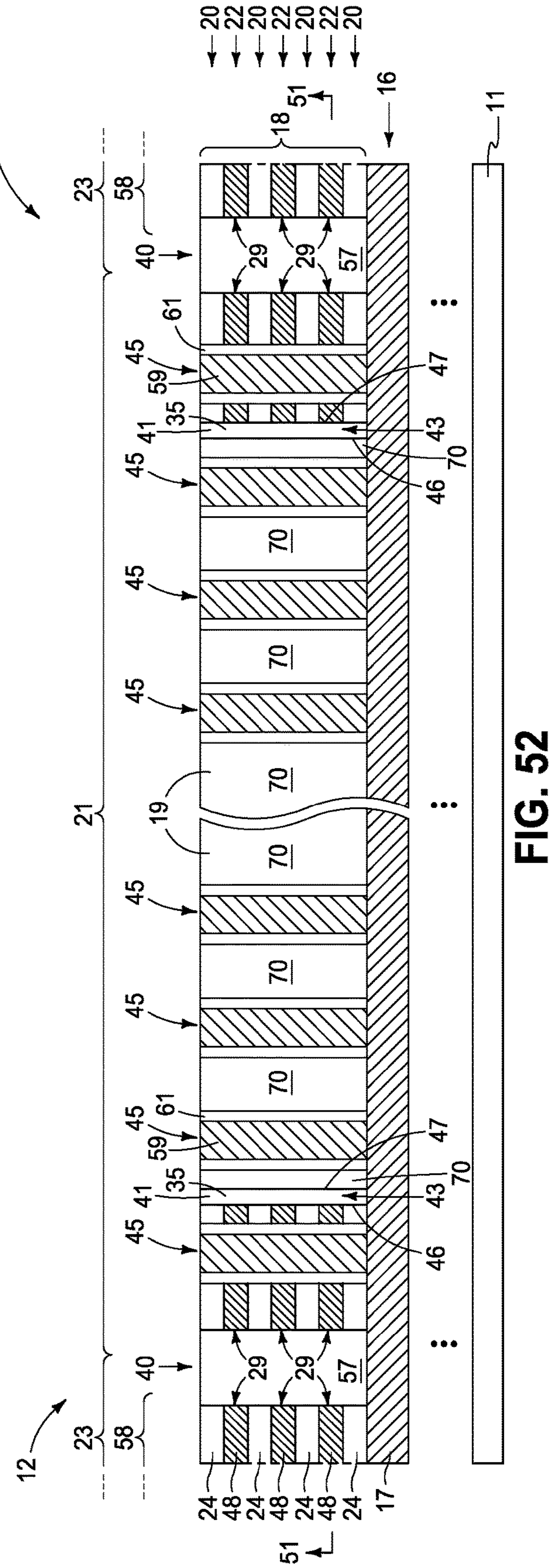
Figure 53:
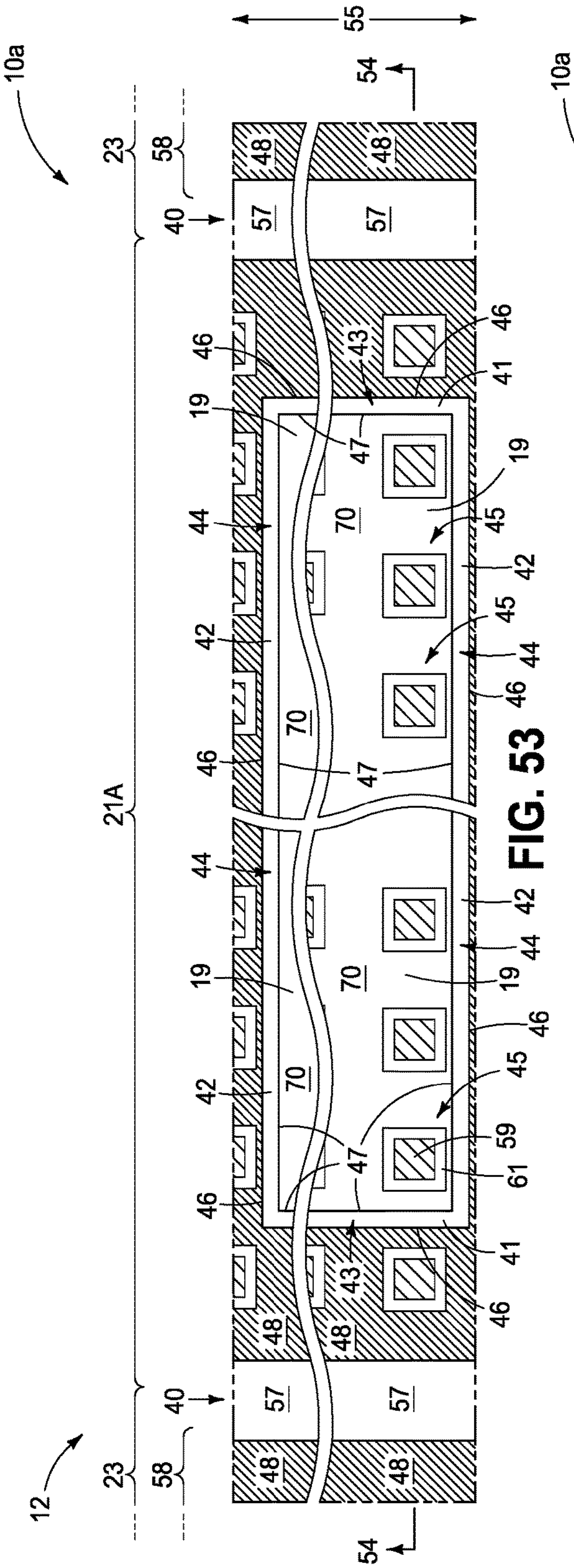
Figure 54:
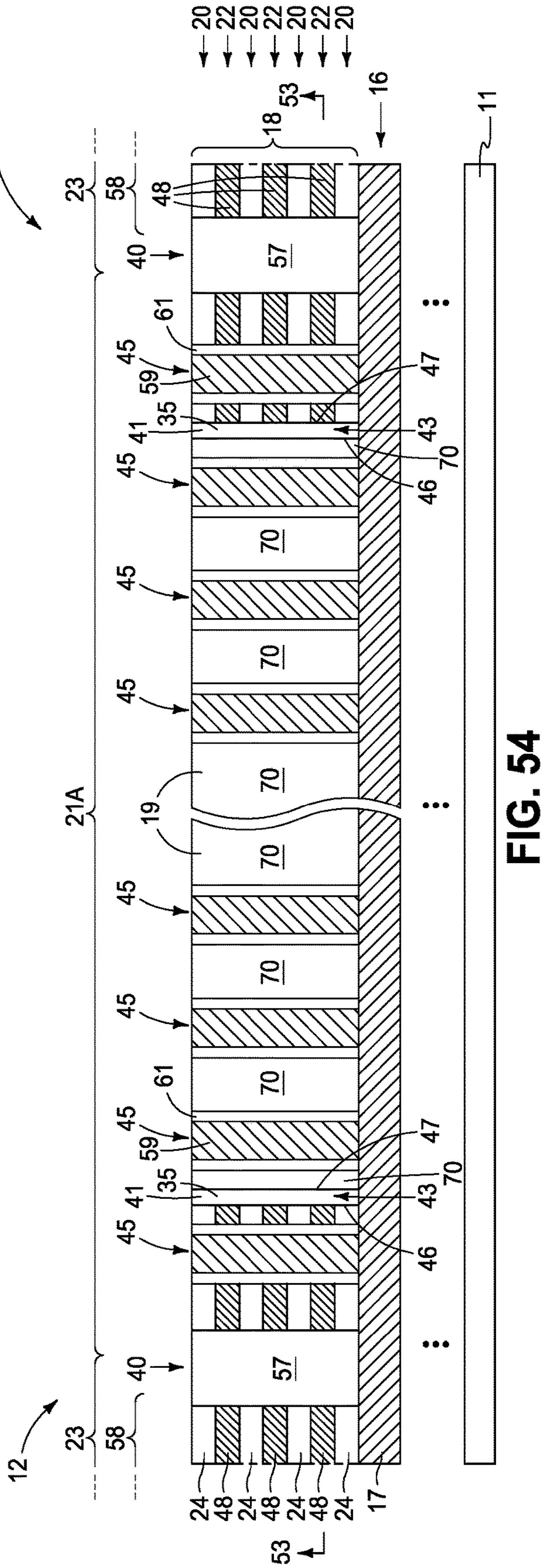
Figure 55:
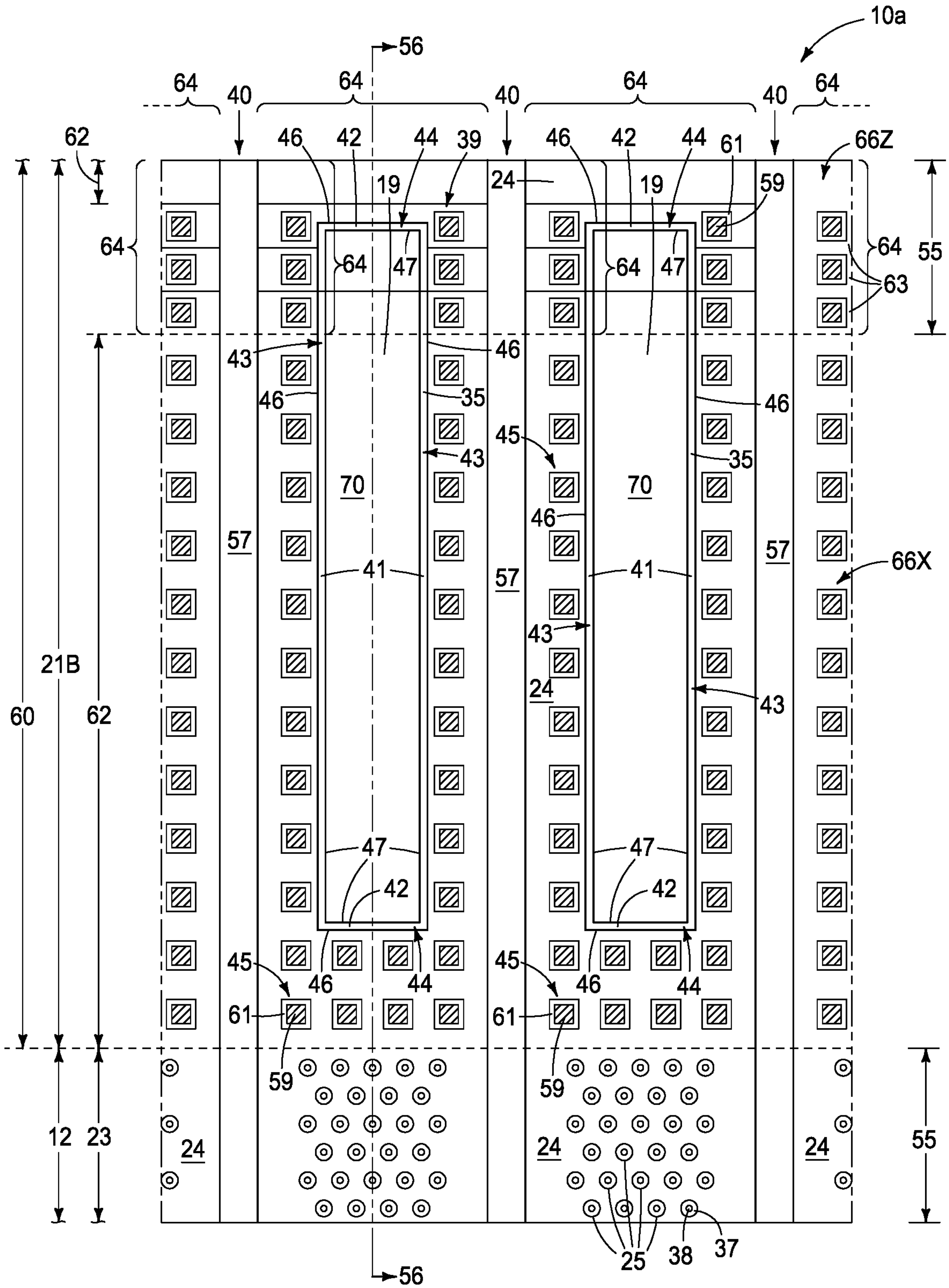
Figure 56:
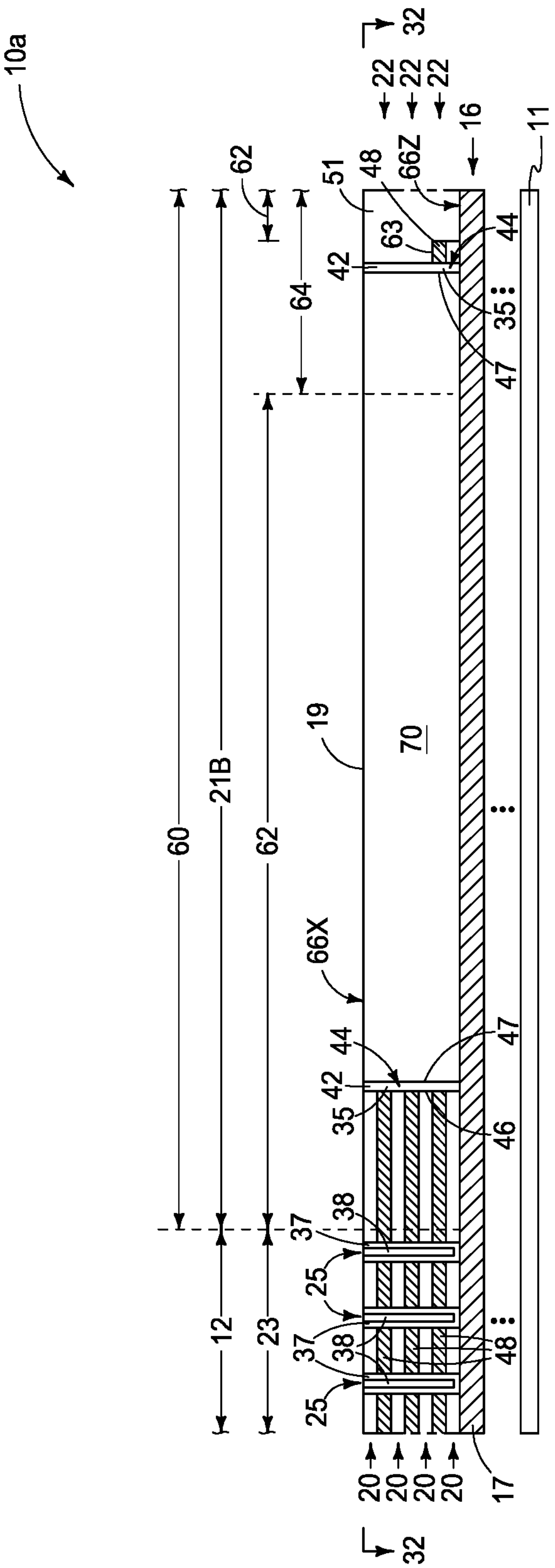

In one such embodiment, the individual stair-step structures are devoid of operative TAV's laterally-between the pair of walls (e.g., FIGS. 48, 55). In one embodiment, the individual stair-step structures comprise a landing region (e.g., 66X) and a step region comprising steps (e.g., 63) that is adjacent the landing region. In one such embodiment, at least a portion of the walls are in the landing region, in one such embodiment at least a portion of the walls are in the step region, and in one such embodiment and as shown are in each of the landing region and the step region. In one embodiment, more elevationally-extending walls (e.g., 44) are provided that connect with the pair of walls (e.g., 43), with the pair of walls and the more walls collectively completely-encircling an island (e.g., 19) that includes space between the laterally-spaced walls of the pair of walls, and in one such embodiment wherein the island is longitudinally-elongated along the pair of walls. In one embodiment, the walls are horizontally parallel relative one another (e.g., walls 43 in FIGS. 48, 55). In one embodiment, at least one of the walls (e.g., a wall 43) is horizontally parallel horizontal-longitudinal-orientation (e.g., along direction 55) of the stair-step structure it is in. In one embodiment, at least one of the walls (e.g., a wall 43*c*) is not horizontally parallel horizontal-longitudinal-orientation (e.g., 43*c* in FIG. 58 referred to below) of the stair-step structure. In one embodiment, at least one of the walls is vertical or within 10° of vertical, and in one embodiment at least one of the walls is horizontally-straight linear. Any other attribute(s) or aspect(s) as shown and/or described herein with respect to other embodiments may be used.

Figure 58:
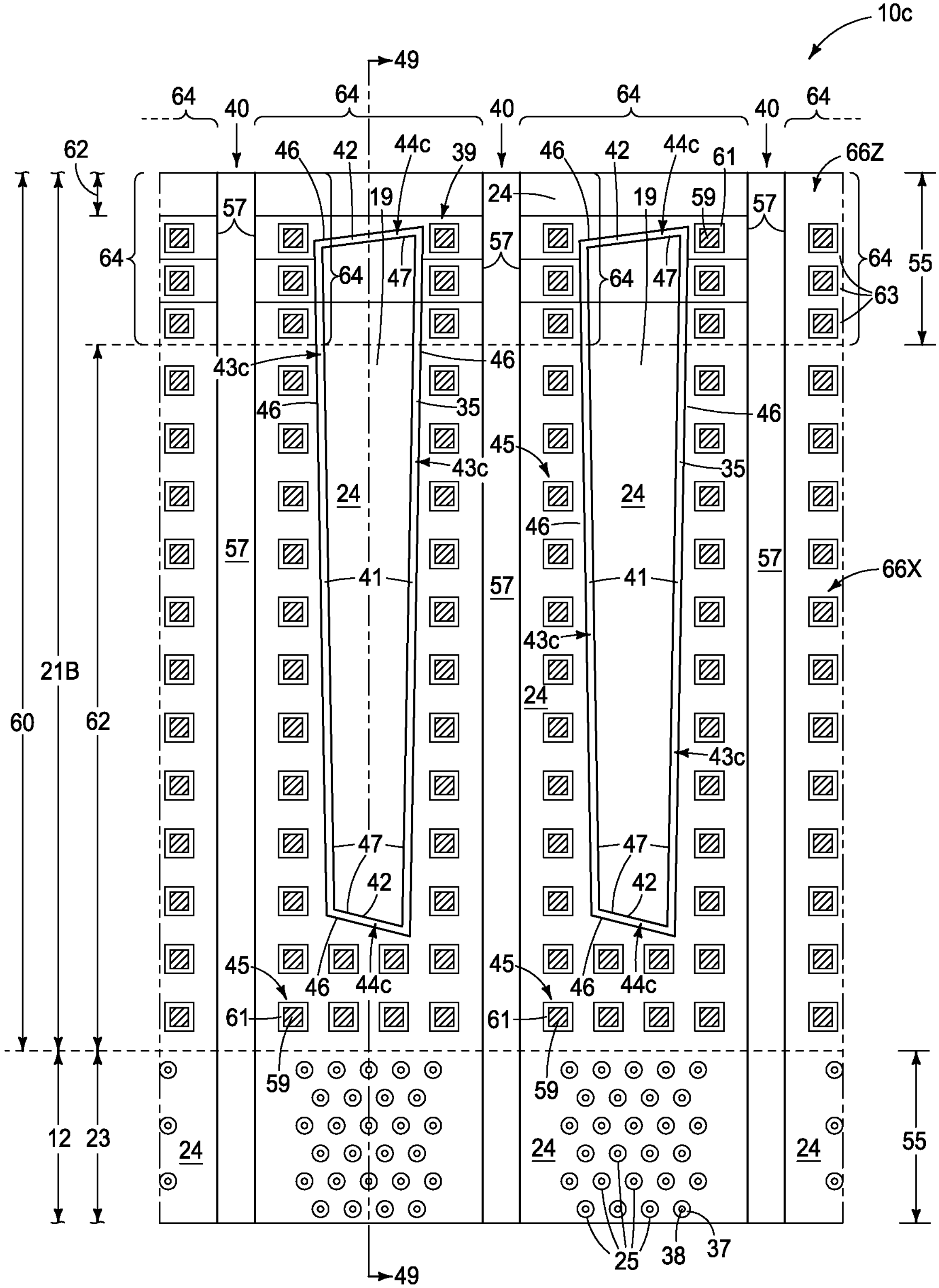

Another such embodiment is shown in FIG. 58 with respect to a construction 10*c*. Like numerals from the above-described embodiments have been used where appropriate, with some construction differences being indicated with the suffix "c". Construction 10*c* includes individual stair-step structures (e.g., 64) comprising a pair of elevationally-extending walls (e.g., 43*c*) that are spaced laterally-inward from sides of the respective stair-step structure, that are laterally-spaced relative one another, and that are individually horizontally-longitudinally-elongated (e.g., along direction 55). At least one of the walls (e.g., a wall 43*c*) is neither horizontally parallel horizontal-longitudinal-orientation (e.g., 55) of its individual stair-step structure nor angled orthogonally relative said horizontal-longitudinal-orientation. In one embodiment, at least one of walls 44*c* (both as shown) is not angled orthogonally relative said horizontal-longitudinal-orientation. Any other attribute(s) or aspect(s) as shown and/or described herein with respect to other embodiments may be used.

Figure 59:
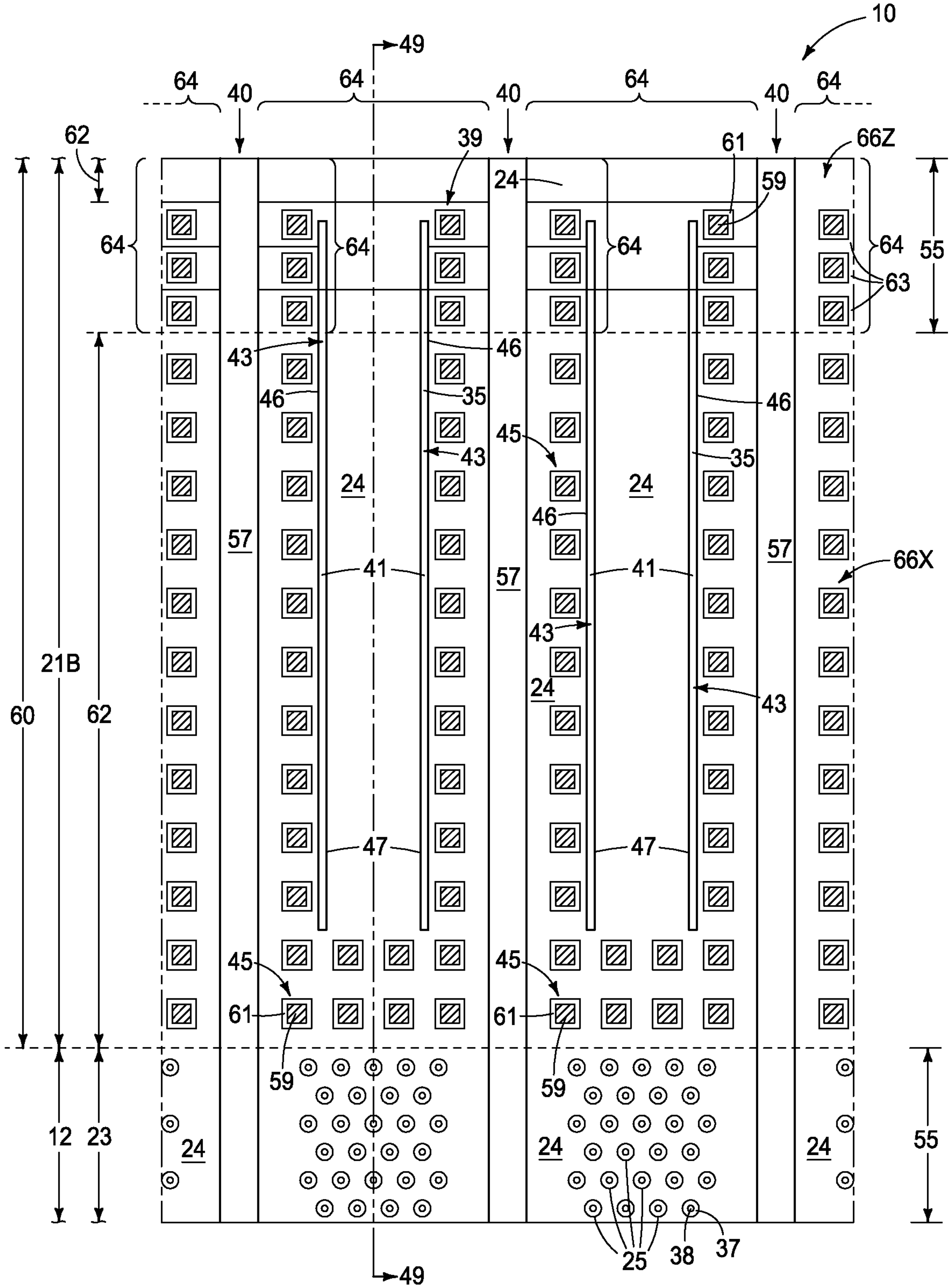

Another such embodiment is shown in FIG. 59 with respect to a construction 10*d*. Like numerals from the above-described embodiments have been used where appropriate, with some construction differences being indicated with the suffix "d". Construction 10*d* includes individual stair-step structures (e.g., 64) that are devoid of any interconnecting wall (e.g., no wall 44, 44*c*) from other embodiments is shown in FIG. 59) that extends laterally between the pair of walls (e.g., 43). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers in a memory-array region. The insulative tiers and the conductive tiers of the laterally-spaced memory blocks extend from the memory-array region into a stair-step region that is adjacent the memory-array region. The insulative tiers and the conductive tiers of the memory blocks in the stair-step region comprise operative stair-step structures that are laterally-spaced relative one another and that are individually horizontally-longitudinally-elongated. Individual of the stair-step structures comprise a pair of elevationally-extending walls that are spaced laterally-inward from sides of the respective stair-step structure, that are laterally-spaced relative one another, and that are individually horizontally-longitudinally-elongated. The individual stair-step structures are devoid of operative TAV's laterally-between the pair of walls.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers in a memory-array region. The insulative tiers and the conductive tiers of the laterally-spaced memory blocks extend from the memory-array region into a stair-step region that is adjacent the memory-array region. The insulative tiers and the conductive tiers of the memory blocks in the stair-step region comprise operative stair-step structures that are laterally-spaced relative one another and that are individually horizontally-longitudinally-elongated. Individual of the stair-step structures comprise a pair of elevationally-extending walls that are spaced laterally-inward from sides of the respective stair-step structure, that are laterally-spaced relative one another, and that are individually horizontally-longitudinally-elongated. At least one of the walls is neither horizontally parallel horizontal-longitudinal-orientation of its individual stair-step structure nor angled orthogonally relative said horizontal-longitudinal-orientation.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers in a memory-array region. The insulative tiers and the conductive tiers of the laterally-spaced memory blocks extend from the memory-array region into a stair-step region that is adjacent the memory-array region. The insulative tiers and the conductive tiers of the memory blocks in the stair-step region comprise operative stair-step structures that are laterally-spaced relative one another and that are individually horizontally-longitudinally-elongated. Individual of the stair-step structures comprise a pair of elevationally-extending walls that are spaced laterally-inward from sides of the respective stair-step structure, that are laterally-spaced relative one another, and that are individually horizontally-longitudinally-elongated. The individual stair-step structures are devoid of any interconnecting wall that extends laterally between the pair of walls.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The operative channel-material strings in the laterally-spaced memory blocks comprise part of a memory plane. An elevationally-extending wall is in the memory plane laterally-between immediately-laterally-adjacent of the memory blocks and that completely encircles an island that is laterally-between immediately-laterally-adjacent of the memory blocks in the memory plane.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The operative channel-material strings in the laterally-spaced memory blocks comprise part of a memory plane. A pair of elevationally-extending walls is in the memory plane laterally-between immediately-laterally-adjacent of the memory blocks, and that are laterally-spaced relative one another, and that are individually horizontally-longitudinally-elongated. At least one of the walls is not horizontally parallel horizontal-longitudinal-orientation of the immediately-laterally-adjacent memory blocks which the at least one of the walls is laterally-there-between.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The operative channel-material strings in the laterally-spaced memory blocks comprise part of a memory plane. A pair of elevationally-extending walls are laterally-spaced relative one another and are individually horizontally-longitudinally-elongated, the pair of walls are edge-of-plane.

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. The memory-block regions comprise part of a memory-plane region. An elevationally-extending wall is formed in the memory-plane region laterally-between immediately-laterally-adjacent of the memory-block regions and that completely encircles an island that is laterally-between immediately-laterally-adjacent of the memory-block regions in the memory-plane region.

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. The memory-block regions comprise part of a memory-plane region. A pair of elevationally-extending walls are formed that are laterally-spaced relative one another and that are individually horizontally-longitudinally-elongated. The pair of walls are in a region that is edge-of-plane relative to the memory-plane region.

In some embodiments, a method used in forming a memory array comprising strings of memory cells comprises forming a stack comprising vertically-alternating first tiers and second tiers. The stack comprises a memory-array region and a stair-step region. Horizontally-elongated trenches are formed into the stack to form laterally-spaced memory-block regions to extend from the memory-array region into the stair-step region, with the memory-block regions in the stair-step region comprising laterally-spaced stair-step-structure regions. A pair of elevationally-extending walls are formed in the laterally-spaced stair-step-structure regions and that are spaced laterally-inward from sides of the respective stair-step-structure region, that are laterally-spaced relative one another, and that are individually horizontally-longitudinally-elongated. The stair-step-structure regions are formed to comprise at least one of (a), (b), and (c), where:

- (a): the individual stair-step-structure regions being devoid of operative TAV's laterally-between the pair of walls;
- (b): at least one of the walls neither being horizontally parallel horizontal-longitudinal-orientation of its individual stair-step structure region nor angled orthogonally relative said horizontal-longitudinal-orientation; and
- (c): the individual stair-step-structure regions being devoid of any interconnecting wall that extends laterally between the pair of walls.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:

- forming a stack comprising vertically-alternating first tiers and second tiers;
- forming horizontally-elongated trenches into the stack to form laterally-spaced memory-block regions, the memory-block regions comprising part of a memory-plane region; and
- forming an elevationally-extending wall in the memory-plane region laterally-between immediately-laterally-adjacent of the memory-block regions and that completely encircles an island that is laterally-between immediately-laterally-adjacent of the memory-block regions in the memory-plane region.

2. The method of claim 1 comprising, after forming the wall, isotropically etching away and replacing sacrificial material that is in the first tiers circumferentially-outward of the island with conductive material of individual conductive lines.

3. The method of claim 1 comprising forming individual memory cells of the strings of memory cells to comprise channel material of operative channel-material strings, a gate region that is part of a conductive line in individual of the first tiers, and a memory structure laterally-between the gate region and the channel material of the operative channel-material strings in the individual first tiers, conductive material of the first tiers being formed after forming the wall.

4. The method of claim 1 comprising forming operative channel-material strings through the second tiers in the memory-block regions and the first tiers before forming the wall.

5. The method of claim 1 comprising forming operative channel-material strings through the second tiers and the first tiers after forming the wall.

6. The method of claim 1 comprising forming the island to be longitudinally-elongated along the pair of walls.

7. A method used in forming a memory array comprising strings of memory cells, comprising:

- forming a stack over a conductor tier, the stack comprising vertically-alternating first tiers and second tiers;
- forming a plurality of channel openings extending through the stack;
- forming channel material within the plurality of channel openings, the channel material being in direct physical contact with a conductive material of the conductor tier;
- forming horizontally-elongated trenches into the stack to form laterally-spaced memory-block regions, the memory-block regions comprising part of a memory-plane region; and
- forming a pair of elevationally-extending walls that are laterally-spaced relative one another and that are individually horizontally-longitudinally-elongated, the pair of walls being in a region that is edge-of-plane relative to the memory-plane region.

8. The method of claim 7 comprising forming more elevationally-extending walls that connect with the pair of walls, the pair of walls and the more walls collectively completely-encircling an island that includes space between the laterally-spaced walls of the pair of walls.

9. The method of claim 8 wherein the pair of walls and the more walls are formed at the same time.

10. The method of claim 8 wherein the island is longitudinally-elongated along the pair of walls.

11. The method of claim 7 wherein the walls are horizontally parallel relative one another.

12. The method of claim 7 wherein at least one of the walls is horizontally parallel a straight-line edge of the region that is edge-of plane.

13. The method of claim 7 wherein at least one of the walls is not horizontally parallel a straight-line edge of the region that is edge-of plane.

14. A method used in forming a memory array comprising strings of memory cells, comprising:

forming a stack comprising vertically-alternating first tiers and second tiers, the stack comprising a memory-array region and a stair-step region;

forming horizontally-elongated trenches into the stack to form laterally-spaced memory-block regions extending from the memory-array region into the stair-step region, the memory-block regions in the stair-step region comprising laterally-spaced stair-step-structure regions;

forming a pair of elevationally-extending walls in the laterally-spaced stair-step-structure regions that are spaced laterally-inward from sides of the respective stair-step-structure region, that are laterally-spaced relative one another, and that are individually horizontally-longitudinally-elongated, the stair-step-structure regions being formed to comprise at least one of (a), (b), and (c), where:

(a): the individual stair-step-structure regions being devoid of operative TAV's laterally-between the pair of walls;

(b): at least one of the walls neither being horizontally parallel horizontal-longitudinal-orientation of its individual stair-step structure region nor angled orthogonally relative said horizontal-longitudinal-orientation; and (c): the individual stair-step-structure regions being devoid of any interconnecting wall that extends laterally between the pair of walls.

15. The method of claim 14 comprising (a).

16. The method of claim 14 comprising (b).

17. The method of claim 14 comprising (c).

18. The method of claim 14 comprising only one of (a), (b), and (c).

19. The method of claim 14 comprising at least two of (a), (b), and (c).

20. The method of claim 19 comprising only two one of (a), (b), and (c).

* * * * *